(12) United States Patent
Yamaura et al.

(10) Patent No.: US 6,466,361 B2
(45) Date of Patent: Oct. 15, 2002

(54) CONVERGING DEVICE AND LIGHT SOURCE MODULE, LASER DEVICE AND OPTICAL SIGNAL AMPLIFIER USING SUCH CONVERGING DEVICE

(75) Inventors: Hitoshi Yamaura; Hiroshi Sekiguchi, both of Akishima (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 09/808,521

(22) Filed: Mar. 14, 2001

(65) Prior Publication Data

US 2002/0051283 A1 May 2, 2002

(51) Int. Cl.⁷ .............................. H01S 3/00; G02B 6/10
(52) U.S. Cl. ........................................ 359/333; 385/146
(58) Field of Search .......................... 359/333; 385/146, 385/147, 133, 89, 901

(56) References Cited

U.S. PATENT DOCUMENTS

| | | | | |
|---|---|---|---|---|
| 3,617,109 A | * | 11/1971 | Tien | 385/29 |
| 5,237,641 A | * | 8/1993 | Jacobson et al. | 385/146 |
| 5,303,322 A | * | 4/1994 | Winston et al. | 385/129 |
| 5,481,385 A | * | 1/1996 | Zimmerman et al. | 349/62 |
| 5,666,189 A | * | 9/1997 | Rostoker et al. | 355/53 |
| 5,810,463 A | * | 9/1998 | Kawahara et al. | 250/227.2 |
| 5,940,571 A | * | 8/1999 | Masaki | 385/146 |
| 6,023,548 A | * | 2/2000 | Heise et al. | 359/618 |
| 6,169,839 B1 | * | 1/2001 | Johanson | 362/560 |
| 6,211,929 B1 | * | 4/2001 | Hiraishi et al. | 349/62 |
| 6,219,366 B1 | * | 4/2001 | Furushima | 372/45 |
| 6,238,943 B1 | * | 5/2001 | Kobayashi et al. | 372/45 |
| 6,335,999 B1 | * | 1/2002 | Winston et al. | 359/559 |

* cited by examiner

Primary Examiner—Thomas H. Tarcza
Assistant Examiner—Andrew R. Sommer
(74) Attorney, Agent, or Firm—Woodard, Emhardt, Naughton Moriarty & McNett

(57) ABSTRACT

There are disclosed a converging device for converging a light having a high aspect ratio, and a light source module, a laser device and an optical signal amplifier using such converging device. A converging device has a converging portion for converging a light. The converging portion has an incident surface, a tip portion and a reflective surface for reflecting the light so that the light is transmitted toward the tip portion. The converging device has a guide portion provided in the reflective surface along a direction from the incident surface to the tip portion. The light transmitted in the converging portion is introduced to the guide portion and the light in the guide portion is reflected so as to be transmitted toward one end of the guide portion. The converged light is emitted from the tip portion or an end of the guide portion.

13 Claims, 26 Drawing Sheets

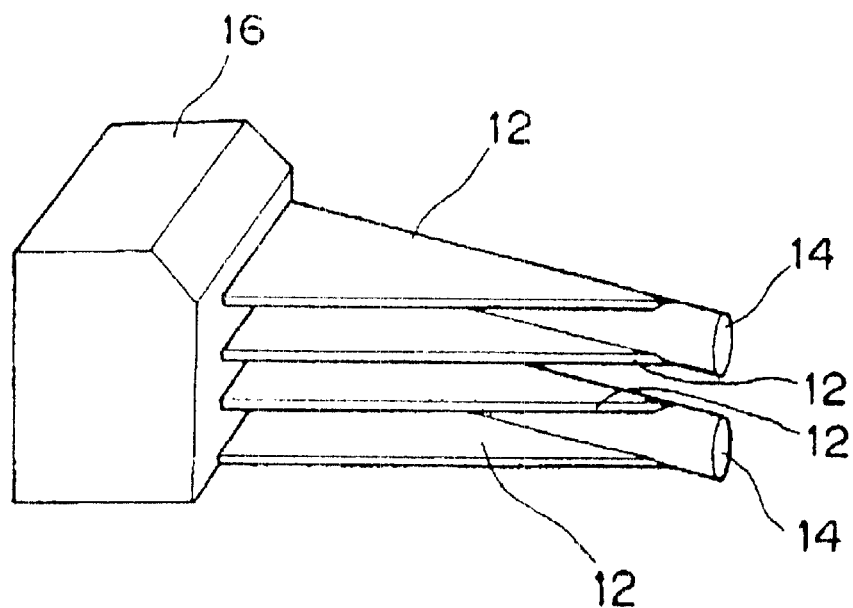
F I G. 2 1
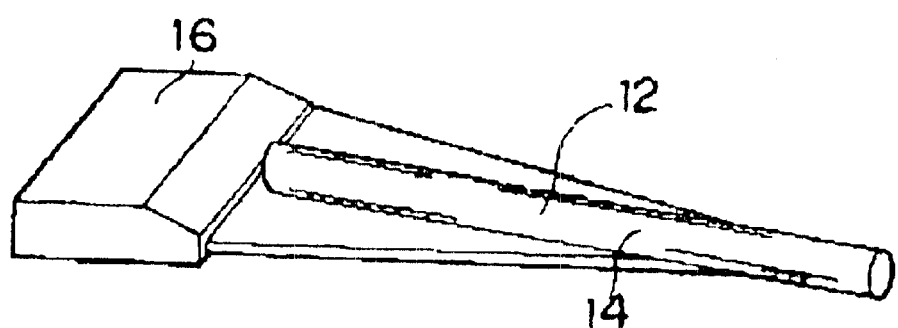
F I G. 2 2

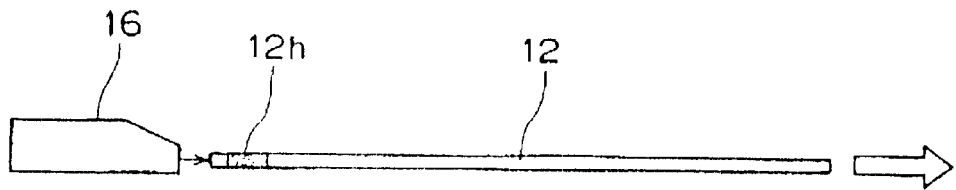
F I G. 3 3
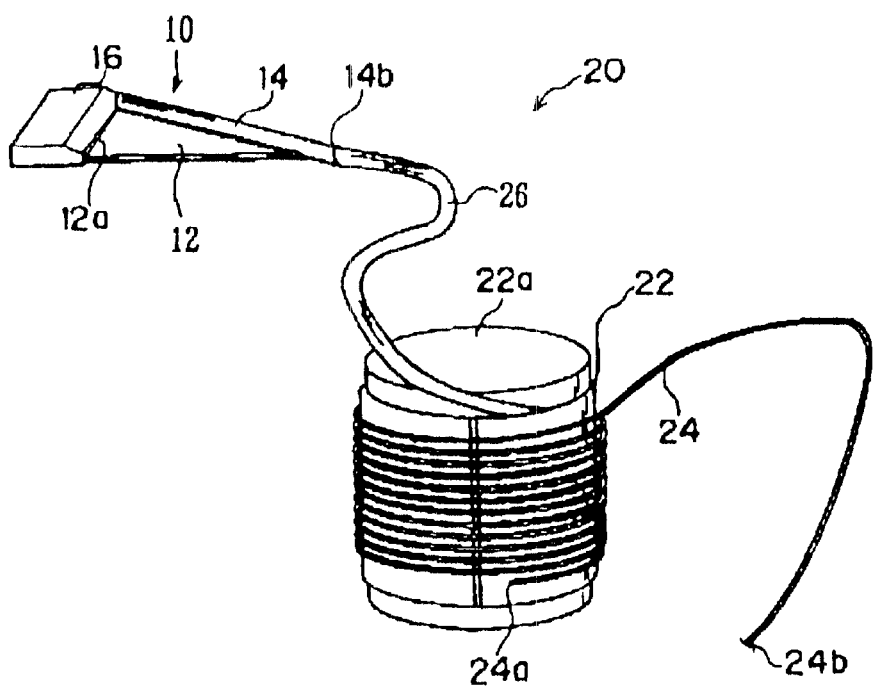
F I G. 3 4

CONVERGING DEVICE AND LIGHT SOURCE MODULE, LASER DEVICE AND OPTICAL SIGNAL AMPLIFIER USING SUCH CONVERGING DEVICE

BACKGROUND OF THE INVENTION

1. Field of the Invention

The present invention relates to a converging device, light source module, a laser device and an optical signal amplifier. More particularly, the present invention relates to a converging device for converging light having a high aspect ratio emitted from a semiconductor array laser to a small spot, and a light source module, a laser device and an optical signal amplifier using such converging device.

2. Description of the Related Art

In the field of optical communications, optical measurement and laser processing, a semiconductor array laser such as laser diode bar (hereinafter, referred to as LD bar) in which a plurality of laser diodes are horizontally aligned is used as a laser device or a pumping source for the laser device. A light emitting surface of the LD bar has a long horizontal axis of approximately 10 mm in a direction of alignment of the laser diodes and a short vertical axis of approximately 1 μm in a thickness direction of the light emitting surface. Thus, a spot of the light emitted from such a light emitting surface has an elliptic shape having a high aspect ratio. When such a light is converged by a normal optical system, the light can be sufficiently converged in the vertical direction, however, the light can only be converged within at most, several millimeters in the horizontal direction.

Therefore, various devices have been developed for converging a light having a large aspect ratio emitted from the LD bar or the like to a small spot having substantially the same length in both directions. Such devices include a fiber coupling system, a two-mirror system and a triangle duct.

In the fiber coupling system, as shown in FIG. 40, the light is input to ends of a plurality of optical fibers 42 which are aligned horizontally adjacent the light emitting surface 40 of the LD bar. Other ends of the fibers 42 are bundled in a round shape to obtain round spot of light therefrom. In this system, however, as the light emitting surface of the converged light is formed by the end surfaces of the bundled fibers, a converging ratio is limited.

In the two-mirror system, as shown in FIGS. 41 and 42, the light is input between the two mirrors 50, 52 which are arranged in a parallel alignment from an upper diagonal upper direction to a lower diagonal direction. The mirrors 50, 52 have reflective surface 50a, 50b which face each other. The light input is reflected repeatedly between the reflective surface 50a, 52a so that the light is shifted both horizontally and vertically. The mirrors 50, 52 face toward each other and are horizontally and vertically space from each other. The light beam (1) passes above the mirror 52 to be emitted and the light beams (2)–(5) are reflected between the reflective surfaces 50a, 52a one to four times and output to be vertically beneath the light beam (1). The light beams (1)–(5) are converted from a horizontal alignment to a vertical alignment in the above manner. Thus, the spot of light is converged to 1/5 in horizontal direction. In this system, however, as a plurality of optical devices are used, alignment of the devices is complex, the cost and time for production and alignment is high and reliability of convergence is low.

In the triangle duct system, as shown in FIG. 43, a duct portion 12 having an equilateral triangle shape, which is made from a thin plate, is prepared. The light to be converged is input from an incident surface 12a, which is a surface at the base of the triangle extending in the thickness direction of the duct portion 12. The light is totally reflected in the reflective surfaces 12b, which is a surface at equal side extending in the thickness direction, to be transmitted toward a vertex of the triangle so as to be converged. The converged light is emitted to an optical fiber 27 provided at the vertex of the duct portion 12. According to the system, as the structure of the device is simple, the time and cost for production and alignment may be decreased, and the reliability for converging the light beams can be improved.

However, in the above triangle duct 12, as reflection of the light in the reflective surface 12b is repeated, an incident angle of the light in the reflective surface 12b decreases. As a result, when the light is intended to be converged to the smaller spot, the incident angle of the light in the reflective surface 12b cannot be maintained within a critical angle of a total reflection. Therefore, according to the above-configured duct, the maximum convergence of the light can only be in the range of 1/3–1/5.

FIG. 44 shows a result of a ray-tracing, in which four parallel light beams at 3 mm pitch are input in an equilateral triangle duct made of a silica glass having a thickness of 100 μm, a vertical angle of 10°, and a width of the incident surface of 12 mm. The light introduced from the incident surface 12a is transmitted toward the vertex of the duct portion 12 by being reflected in the reflective surfaces 12b. As the reflection is repeated, the incident angle of the light in the reflective surface 12b decreases. Adjacent the vertex of the duct portion 12, the incidental angle of the light cannot be maintained within the critical angle of the total reflection and the light is leaked outside the duct portion 12. As a result, converged light with a small spot cannot be obtained from the vertex of the duct portion 12.

In order to solve the above problem, as shown in FIG. 45, a convex surface may be formed in the incident surface 12a of the duct portion 12 for refracting the light toward the vertex of the duct portion 12 in order to reduce the number of reflections in the reflective surface 12b. In such a duct, since both edges of the incident surface 12a cannot be placed closely to the light emitting surface of the LD bar 16, the light is leaked from both of the edges to lower a coupling efficiency.

Therefore, there is a demand for a converging device for converging the light to the smaller spot by utilizing the advantages of the triangle duct.

It is an object of the present invention to provide converging device which can efficiently converge a light having a high aspect ratio to a smaller spot with a simple structure. It is another object of the present invention to provide a light source module, a laser device and an optical signal amplifier using such a converging device.

SUMMARY OF THE INVENTION

In order to achieve the above object, there is provided a converging device comprising a converging portion for converging a light, said converging portion having an incident surface in which a light to be converged is introduced, a tip portion provided in an opposite side of said incident surface in a direction of transmission of said light and a reflective surface for reflecting said light introduced from said incident surface so that said light is transmitted toward said tip portion, and a guide portion provided in said reflective surface along a direction from said incident surface to said tip portion, wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion.

In the above converging device, the light introduced to the converging device from the incident surface is transmitted toward the tip portion to be converged by being reflected in the reflective surface. The converged light is finally emitted from the tip portion or the end of the guide portion. According the above converging device, since the light transmitted in the converging portion is introduced to the guide portion, a length of the light path and the number of reflections of the light in the converging portion can be reduced. Thus, the light can be converged to a small spot before the incident angle of the light in the reflective surface becomes smaller than the critical angle of the total reflection.

In the above converging device, said converging portion is formed in a shape of a triangle and made of a thin plate which is optically transparent with respect to a wavelength of light to be converged. The incident surface is a surface at one side of said triangle extending in a thickness direction of the converging portion, said reflective surface is a surface at other side of said triangle which extends in a thickness direction of said converging portion, and said tip portion is a vertex of said triangle spaced from said incident surface.

In the above converging device, the converging portion is made in a shape of a triangle plate. The light is introduced from the incident surface which is a face at one side of the triangle extending in a thickness direction of the converging portion. The light is transmitted toward the tip portion of the triangle to be converged by being reflected between the reflective surfaces which are surfaces at other sides of the triangle extending in a thickness direction of the converging portion. When light reaches a boundary between the converging portion and the guide portion, the light is introduced in the guide portion and transmitted therein. The converged light is finally emitted from the tip portion or the end of the guide portion.

According the above converging device, when the light reaches a boundary between the converging portion and the guide portion, the light is introduced in the guide portion and transmitted therein. Thus, a length of the light path and the number of reflections of the light in the converging portion can be reduced. As a result, the light can be converged to a small spot before the incident angle of the light in the reflective surface becomes smaller than the critical angle of the total reflection.

In the above converging device, the guide portion can be provided along from said incident surface to said tip portion. According to the above invention, the guide portion can be easily produced and the light is easily introduced from the converging portion and the guide portion.

In the above converging device, the guide portion can be formed in a shape of a fiber. According to the above converging device, the converged light can be output from the guide portion.

In the above converging device, said guide portion may have a free curved surface formed by melting said reflective surface of said converging portion. According to the above converging device, the guide portion with a smooth surface can be prepared by a simple operation.

In the above converging device, said converging portion may have a shape of a thin plate, and a maximum thickness of said guide portion in a thickness direction of said converging portion is more than two times that of said converging portion. In the above converging device, when the guide portion has a circular cross-section, the maximum thickness means a diameter of the guide portion. According to the above converging device, the light can be easily confined in the guide portion and the light can be transmitted longer in the guide portion. Thus, the In the above converging device, said converging portion has a shape of a thin plate and a gap is formed between the center of said converging portion and that of said guide portion. According to the present converging device, an incident angle of the light introduced from the converging portion to the guide portion can be made larger. Thus, since the light can be easily confined in the guide portion, the light can be converged to a small spot.

The above object of the present invention is achieved by a light source module comprising a light source having a light emitting surface for emitting a light, said light emitting surface having a short axis and a long axis, and a converging device for converging said light, said converging device comprising a converging portion for converging a light, said converging portion having an incident surface in which said light to be converged is introduced, a tip portion provided in an opposite side of said incident surface in a direction of transmission of said light and a reflective surface for reflecting said light introduced from said incident surface so that said light is transmitted toward said tip portion, and a guide portion provided in said reflective surface along a direction from said incident surface to said tip portion, wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion. According to the present light source module, a light having a high aspect ratio which is emitted by a LD bar or the like can be converged to a small spot.

The above object of the present invention is achieved by a light source module comprising a light source having a light emitting surface for emitting a light, said light emitting surface having a short axis and a long axis, and a plurality of converging devices for converging said light, said converging device is aligned in one of a horizontal direction and a vertical direction, each of said converging device comprising a converging portion for converging said light, said converging portion having an incident surface in which a light to be converged is introduced, a tip portion provided in an opposite side of said incident surface in a direction of transmission of said light and a reflective surface for reflecting said light introduced from said incident surface so that said light is transmitted toward said tip portion, and a guide portion provided in said reflective surface along a direction from said incident surface to said tip portion, wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion.

According to the present light source module, since a light emitted from one light source is converged by a plurality of converging devices, the light can be converged in a smaller spot. In this light source module, a plurality of converging devices can be arranged both horizontally and vertically, in another words, in second dimension.

The above object of the present invention is achieved by a laser device comprising a laser fiber including a laser medium, said laser fiber outputting a laser beam when said laser medium is pumped, a light source for emitting a pumping light to pump said laser medium, a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, and said converged pumping light is emitted from at least one of said tip portion and said one end of said guide portion, an optical member made of an optically transparent material with respect to said pumping light, in which said pumping light converged by said converging device is confined, and wherein at least a part of a lateral side of said laser fiber is connected to said optical member either directly or via an optical medium and said laser medium is pumped by said pumping light transmitted from said optical member to said laser fiber.

In the above laser device, the pumping light emitted from the light source is converged by the converging device and the converged pumping light is confined in the optical member. When the pumping light reaches a boundary between the optical member and the laser fiber, the pumping light is introduced in the laser fiber. The pumping light stimulates the laser medium doped in the core to generate a laser beam by a stimulated emission effect. The laser beam travels in the laser fiber to be output from the end.

According to the above laser device, the laser beam is generated by the pumping light with a high energy density, which is converged by the converging device. Therefore, a desired amount of the pumping light can be introduced in the optical member, depending upon target laser power, a high power laser beam can be provided. In addition, since the pumping light can be introduced to the optical member from a small area of the optical member, radiation of the pumping light can be limited.

The above object of the present invention is achieved by a laser device comprising a pumping source for emitting a pumping light, and a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, wherein said guide portion is a laser fiber including a laser medium, said guide portion outputting a laser beam when said laser medium is pumped by said pumping portion.

In the above laser device, the pumping light emitted from the light source is introduced in the converging device. The pumping light is transmitted toward the tip portion of the converging portion by being reflected in the reflective surface of the converging portion. The pumping light is introduced in the laser fiber. The pumping light stimulates the laser medium doped in the core to generate a laser beam by a stimulated emission effect. The laser beam travels in the laser fiber to be output from the end.

According to the above laser device, the laser beam is generated by the pumping light with a high energy density, which is converged by the converging device. Therefore, a desired amount of the pumping light can be introduced in the optical member, depending upon target laser power, a high power laser beam can be provided. In addition, since the pumping light can be introduced to the optical member from a small area of the optical member, radiation of the pumping light can be limited.

The above object of the present invention is achieved by an optical signal amplifier for amplifying an optical signal comprising a laser device, said laser device comprising a laser fiber including a laser medium, said laser fiber outputting a laser beam when said laser medium is pumped, a light source for emitting a pumping light to pump said laser medium, a converging device for converging said pumping light, said converging device comprising a converging portion for converging a light, said converging portion having an incident surface in which a pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, and said converged light is emitted from at least one of said tip portion and said one end of said guide portion, a optical member made of an optically transparent material with respect to said pumping light, in which said pumping light converged by said converging device is confined, and wherein at least a part of a lateral side of said laser fiber is connected to said optical member either directly or via an optical medium and said laser medium is pumped by said pumping light transmitted from said optical member to said laser fiber, wherein one end of said laser fiber is an input end of said optical signal and the other end is an output end of said optical signal.

The above object of the present invention is achieved by a optical signal amplifier for amplifying an optical signal comprising a laser device, said laser device comprising a pumping source for emitting a pumping light, and a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, wherein said guide portion is a laser fiber including a laser medium, said guide portion outputting a laser beam when said laser medium is pumped by said pumping portion, wherein one end of said laser fiber is an input end of said optical signal and the other end is an output end of said optical signal.

According to the above inventions, optical signal amplifiers can be realized by utilizing the laser device with a high efficiency.

BRIEF DESCRIPTION OF THE DRAWINGS

FIG. 21 is a perspective view showing a fifth variation of the first embodiment of the present invention, in which light is introduced;

FIG. 22 is a perspective view showing a converging device in which a guide portion is provided along a center of the duct portion;

FIG. 33 is a side view showing the fourth embodiment of the converging device according to the present invention;

FIG. 34 is a perspective view showing a first embodiment of a laser device according to the present invention;

FIG. 41 is a plan view showing a conventional converging device of a two-mirror system;

FIG. 42 is a side view showing the conventional converging device of the two-mirror system;

DESCRIPTION OF THE PREFERRED EMBODIMENTS

The preferred embodiments of the present invention will now be described in further detail.

Figure 1:
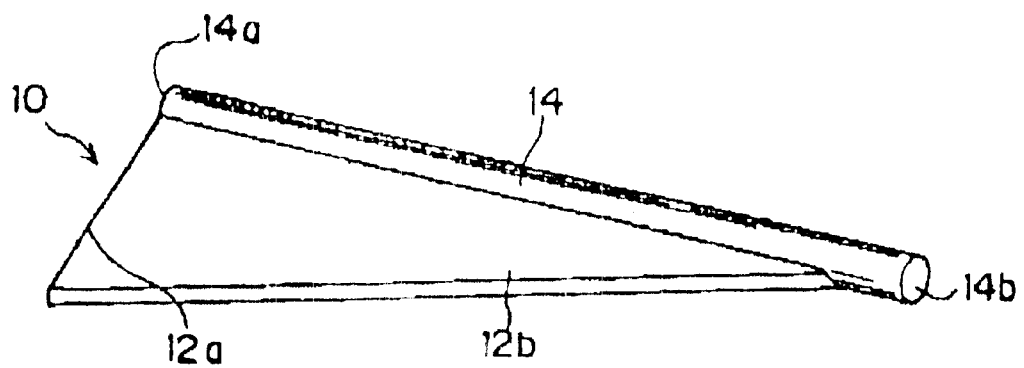
FIG. 1 is a perspective view showing a first embodiment of a converging device according to the present invention.
Figure 2:
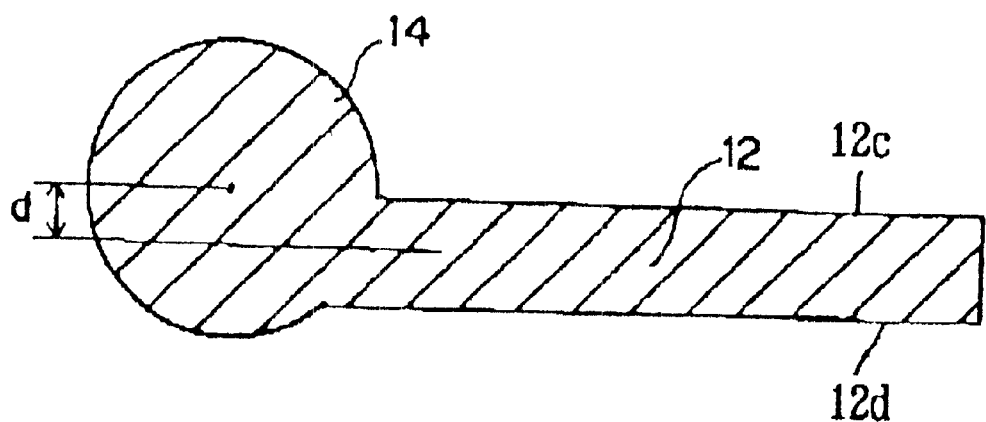
FIG. 2 is a sectional view showing the first embodiment of the converging device of the present invention.

FIGS. 1 and 2 show a converging device of a first embodiment of the present invention. The converging device can be utilized to converge a light beam having a high aspect ratio emitted from the LD bar or the like. As shown in FIG. 1 and 2, the converging device 10 has a duct portion 12 as a converging portion for converging a light and a guide portion 14 provided on a side surface of the duct portion 12.

The duct portion 12 is formed in the shape of an equilateral triangle by a thin plate having a thickness which is greater than a light emitting surface of a LD bar. The duct portion 12 has an incident surface 12a, which is a surface at a base of the triangle and is extending in the thickness direction of the duct portion 12. The light introduced in the incident surface 12a travels in the duct portion 12 by reflecting between an upper surface 12c and a lower surface 12d of the duct portion 12. The light is transmitted toward a vertex or tip of the duct portion 12 by being reflected between the reflective surfaces 12b. The reflective surface 12b is a surface at an equal side of the triangle which is extending in a thickness direction of the duct portion. The duct portion 12 may be made of optically transparent material for the light to be converged. Such material includes glass, such as silica glass and phosphate glass, plastics and optical crystals.

The duct portion 12 is preferably formed as thin as possible. In fact, the duct portion 12 is only required to be thick enough for the light to be introduced therein and for maintaining a minimum required mechanical strength. The normal LD bar has a light emitting surface having a thickness of several micrometers, and a vertical divergent angle of approximately 30° as a half value in its divergence. When the distance between the incident surface 12a of the duct portion 12 and the light emitting surface of the LD bar is set to be 50 μm, a duct portion 12 having a thickness of approximately 100 μm can be used. The duct portion 12 having such a thin plate structure can be produced by a polishing operation or flame deposition when the duct is made of a glass such as silica glass.

In one of the reflective surfaces 12b, the guide portion 14 is provided. The guide portion 14 is made of an optically transparent material having the same or similar refractive index as the duct portion 12 so that when light traveling in the duct portion 12 reaches a boundary between the reflective surface 12b and the guide portion 14, the light is introduced and transmitted in the guide portion 14. Normally, the guide portion 14 is made of the same material as the duct portion 12. Such material includes glass such as silica glass and phosphate glass, plastics and optical crystals.

Figure 3:
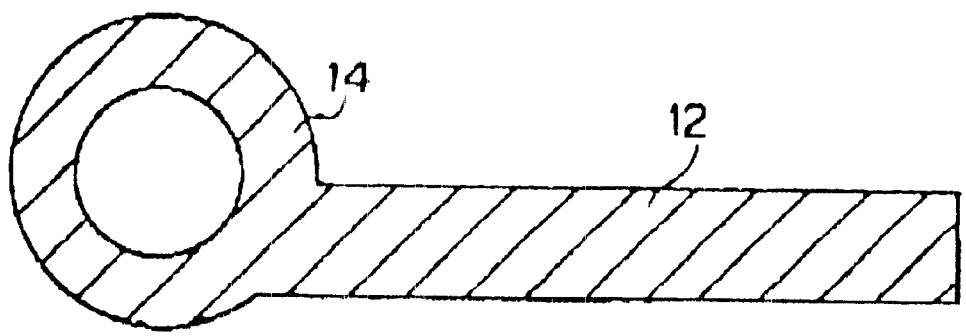
FIG. 3 is a sectional view showing the converging device having a hollow guide portion.
Figure 4:
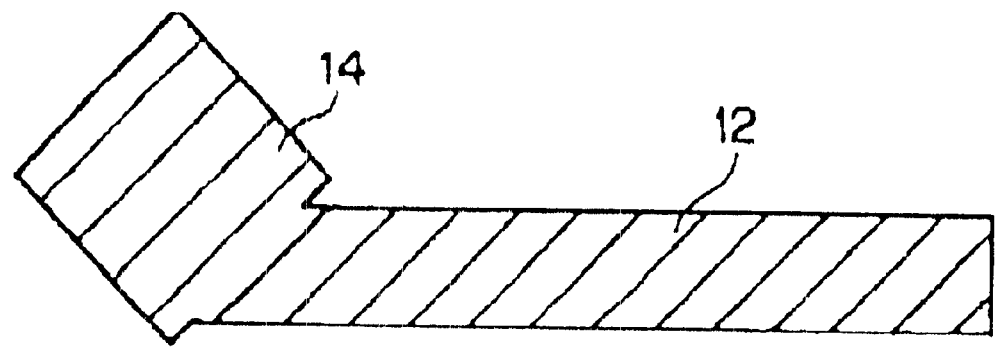
FIG. 4 is a sectional view showing the converging device having a guide portion having a square cross-section.

The guide portion 14 can be formed in a desired shape by a suitable material as long as the light can be introduced from the duct portion 12 to the guide portion 14, the light introduced therein can be transmitted toward an end portion of the guide portion 14 and an incident angle to the reflective surface 12b of the light returned from the guide portion 14 to the duct portion 12 is maintained substantially as total reflection. For example, the guide portion may be made to have a hollow structure shown in FIG. 3, a square sectional shape structure shown in FIG. 4 or an elliptic sectional shape structure. Normally, the guide portion 14 has one end 14a which is formed with the same flat face as the incident surface 12a of the duct portion 12, and the other end 14b which protrudes from the vertex of the duct portion 12 as an output end. The other end 14b, as a output end, has either a vertical broken end or a flat polished end, which can emit the light. In the output end 14b, an antireflective film may be provided when necessary.

The diameter of the guide portion 14 is larger than the thickness of the duct portion 12, and the guide portion 14 is usually more than twice, preferably four times as thick as the duct portion. As the duct portion 12 becomes thinner with respect to the guide portion 14, the length of the light path in the guide portion 14 increases so that more light can be introduced in the duct portion 12 to be converged to a small spot.

Figure 5:
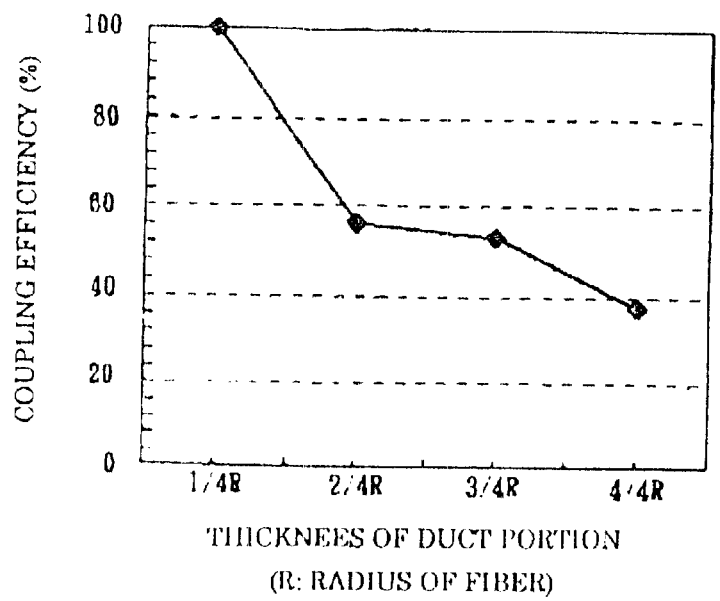
FIG. 5 is a graph showing a relationship between a thickness of the duct portion and a coupling efficiency.
Figure 6:
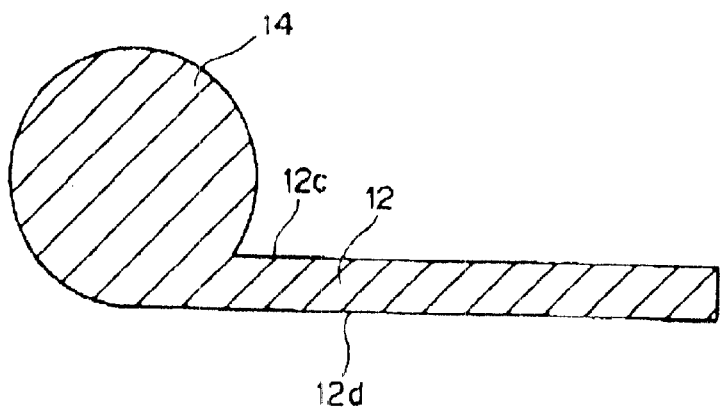
FIG. 6 is a sectional view showing another example of the first embodiment of the converging device of the present invention.

FIG. 5 is a graph showing the relationship between a coupling efficiency and a thickness of the duct portion 12 with respect to the diameter of the guide portion 14, which is analyzed by a ray-tracing method. The coupling efficiency is defined as a ratio of the amount of the emitted light with respect to that of the introduced light. The converging device 10 used in conjunction with FIG. 5 has a width of the incident surface 12a of 12 mm, a vertex angle of 10°, a radius of the guide portion 14 of 250 μm, in which the lower face 12d of the duct portion 12 and a lower edge of the guide portion 14 are in the same plane, as shown in FIG. 6. Four light sources at 3 mm pitch are provided at a position which is 50 μm distant from the incident surface 12a of the duct portion 12, and a total of eight light beams having a divergent angle of 30° are introduced from the light sources. As can be seen from FIG. 5, as the thickness of the duct portion 12 with respect to the radius of the guide portion 14 becomes smaller, the coupling efficiency increases.

Figure 7:
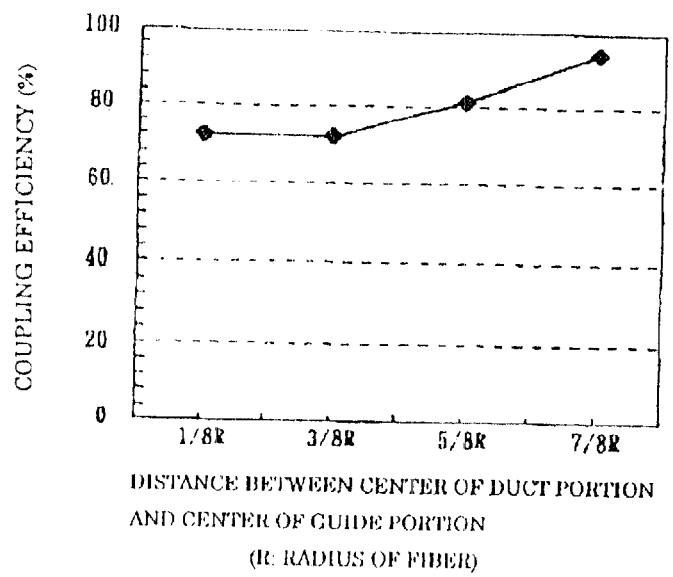
FIG. 7 is a graph showing a relationship between the coupling efficiency and an off-set mount of the duct portion and the guide portion.

Between a center of the guide portion 14 and a center in the thickness direction of the duct portion 12, a gap is preferably provided, as shown in FIG. 2. By providing an off-set amount d between the guide portion 14 and the duct portion 12 in this manner, an incident angle of the light introduced from the duct portion 12 to the guide portion 14 increases so that the light can be easily confined and transmitted in the guide portion 14. FIG. 7 is a graph showing the relationship between the coupling efficiency and a distance between the center of the guide portion 14 and the center in the thickness direction of the duct portion 12, which is analyzed by a ray-tracing method. The converging device used in FIG. 7 has a duct portion having a thickness of 62.5 μm, a width of the incident surface 12a of 12 mm, a vertex angle of 10°, and the guide portion 14 having a radius of 250 μm. Four light sources at 3 mm pitch are provided at a position which is 50 μm distant from the incident surface 12a of the duct portion 12, and eight light beams having a divergent angle of 30° are introduced from the light sources. As can be seen from FIG. 7, as the distance between the center of the duct portion 12 and the that of the guide portion increases, the coupling efficiency increases.

The above-discussed converging device 10 can be produced by welding the reflective surface 12b of the duct portion 12 to form a free cylindrical surface by an irradiation of a carbon dioxide laser beam or the like to the reflective surface 12b. According to this method, the guide portion 14 in the shape of a fiber shape and having a smooth surface can be produced by a simple operation. Alternatively, the converging device 10 can be produced by coupling an optical fiber to the reflective surface 12b which has been melted by the irradiation of a carbon dioxide laser beam or the like. According to this method, as the light emitted from the guide portion 14 can be introduced by the optical fiber, the converging device 10 can be utilized in a wider range of use.

The incident surface 12a of the duct portion 12 and the output end 14b of the guide portion 14 are preferably either a vertical broken surface or a flat polished surface, from which the light can be introduced or emitted. The converging device 10, except the incident surface 12a and the output end 14b, is preferably coated with a polymer having a low refractive index in order to remove adverse external environmental influences such as dust in the air and to protect and maintain the device.

In the above-discussed converging device 10, a refractive index of the duct portion 12 and the guide portion 14 can be set in a desired range as long as it does not deteriorate the converging function of the duct portion 12 and the guiding function of the guide portion 14. For example, the duct portion 12 and the guide portion 14 may have the same refractive index or one may have a larger refractive index than the other.

Figure 8:
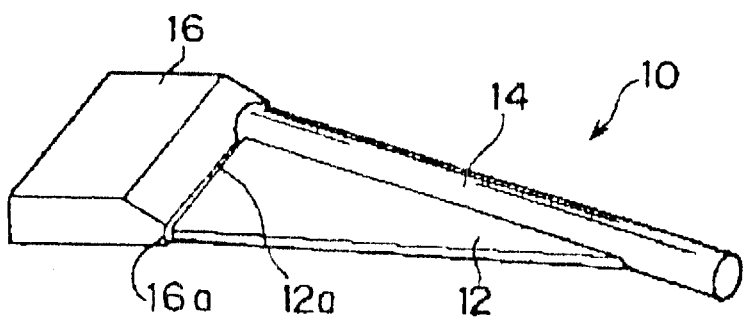
FIG. 8 is a perspective view showing an example for inputting a light to the converging device.

In the above-discussed converging device 10, the light can be introduced in a manner that the incident surface 12a of the duct portion 12 is placed adjacent to the light emitting surface 16a of the LD bar 16, as shown in FIG. 8. Between the incident surface 12a of the duct portion 12 and the light emitting surface 16a of the LD bar 16, a cylindrical lens or a microlens array may be provided to collimate the light emitted from the LD bar 16.

Figure 9:
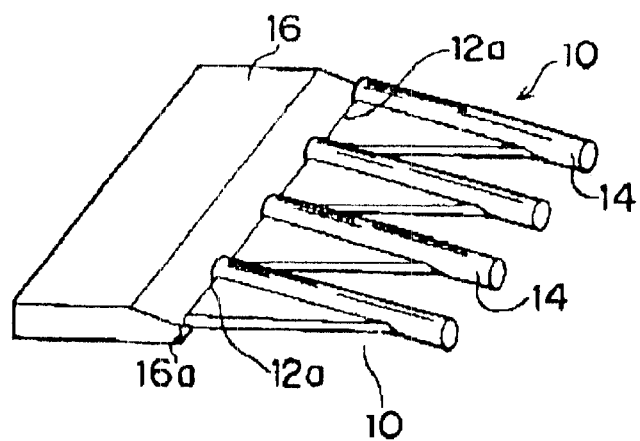
FIG. 9 is a perspective view showing other example for inputting a light to the converging device.
Figure 10:
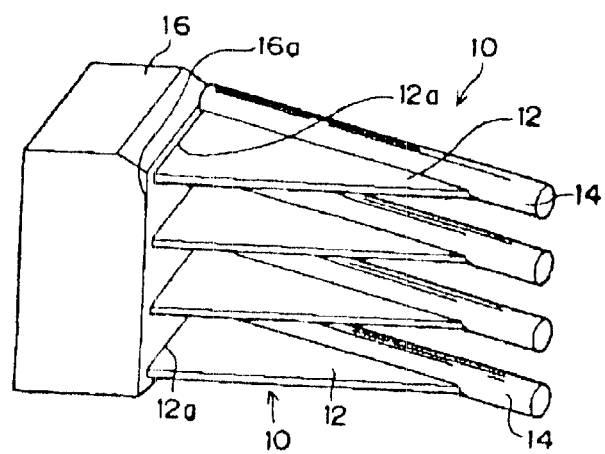
FIG. 10 is a perspective view showing other example for inputting a light to the converging device.

Alternatively, a plurality of converging device 10 can be arranged horizontally with respect to one LD bar 16 as shown in FIG. 9, or vertically as shown in FIG. 10. When four converging devices having the same reduced ¼ size of the original device are aligned horizontally, a laser beam emitted from the LD bar 16 is converged in four guide portions 14. In this case, a cross-sectional area of each guide portion is 1/16 of that of the original device, and the total cross-sectional area of the four guide portions is ¼ of that of the original device. As a result, an energy density or luminance of the light can be four times as strong as the original device. In addition, the number of reflections in the duct portion 12 can be reduced, and since the duct portion 12 has a shorter length, the light path in the guide portion becomes shorter in the same proportion. Therefore, the thickness of the duct portion 12 can be made thicker than ¼ of the original device.

Hereinafter, the function of the above converging device will be described.

Figure 11:
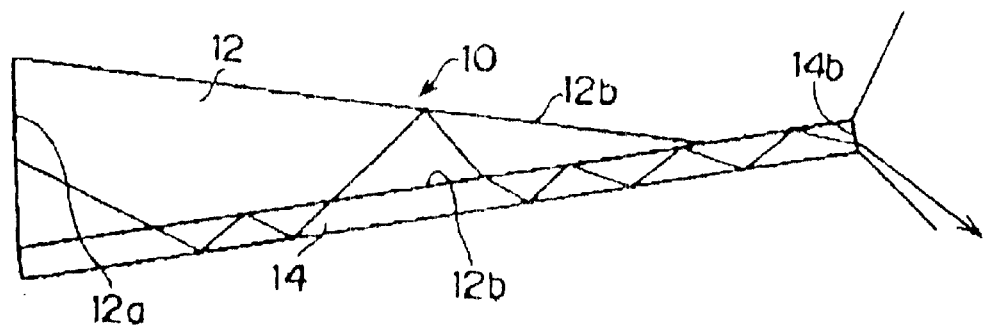
FIG. 11 is a plan view showing a function of the converging device of the present invention.

First, the function of the converging device in which the duct portion 12 and the guide portion 14 has the same refractive index is described, referring to FIG. 11. When the incident surface 12a of the duct portion 12 is placed adjacent the light emitting surface of the LD bar 16, the light emitted from the LD bar is introduced from the incident surface to the duct portion 12. The light is transmitted by reflecting between the upper surface and lower surface of the duct portion 12. The light travels in the duct portion by being reflected between the upper surface 12c and the lower surface 12d and transmitted toward the vertex of the duct portion 12 by being reflected between the reflective surfaces 12b of the duct portion 12. When the light reaches the boundary of the guide portion 14 and the reflective surface 12b, the light is introduced to the guide portion 14. The light introduced therein circumferentially travels along the inner surface of the guide portion 14 and then returns to the duct portion 12.

The incident angle of the light returned from the guide portion 14 is the same as that of the light before being introduced to the guide portion. This is so because the incident angles do not change when the light in transmitted in the guide portion 14. Thus, the incident angle of the light returned from the guide portion 14 to duct portion 12 is larger than that of the light assumed to be transmitted only in the duct portion 12. As a result, since a condition of total reflection in the duct portion 12 is maintained adjacent the vertex of the duct portion 12, the light can be converged to a smaller spot by the duct portion 12 having the guide portion 14 when compared to a duct not having the guide portion 14.

The light returned to the duct portion 12 is reflected in the reflective surface 12b not connected the guide portion 14 and reaches the reflective surface 12b having a connection to the guide portion 14 and introduced to the guide portion 14 to be transmitted therein. After this process is repeated several times, the light is finally emitted from the output end 14b of the guide portion 14.

According to the above converging device, the number of reflections of the light in the duct portion 12 can be reduced by introducing the light reaching the reflective surface 12b in the guide portion 14. Thus, the light can reach the vertex of the duct portion 12 before the incident angle of the light in the reflective surface 12b becomes smaller than the critical angle of the total reflection. Therefore, the light having a large aspect ratio, which is emitted from the LD bar 16 or the like, can be converged to a smaller spot.

Figure 12:
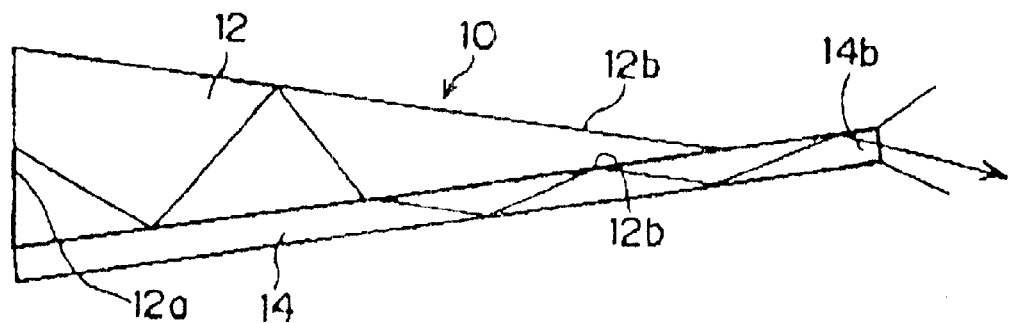
FIG. 12 is a plan view showing a function of the converging device of the present invention.

Next, the function of the converging device in which the guide portion 14 has a smaller refractive index than the duct portion 12 is described, referring to FIG. 12. The light introduced to the duct portion 12 from the incident surface 12a travels toward the vertex of the duct portion 12 by being repeatedly reflected between the reflective surfaces 12b. The incident angle of the light in the reflective surface 12b decreases each time the light is reflected in the reflective surface 12b. When the condition of the total reflection in the boundary between the reflective surface 12b and guide portion 14 is not maintained, the light is introduced to the guide portion 14 from the duct portion 12. In this case, the light is necessarily introduced to the guide portion 14 because of the difference in refractive index between the guide portion 14 and the air. At this time, because of the difference in refractive index between the duct portion 12 and the guide portion 14, the angle between the light path in the guide portion 14 and an optical axis of the guide portion 14 decreases. The light circumferentially travels along the inner surface of the guide portion 14. The light returns to the duct portion 12 and is introduced to the guide portion 14 again, depending upon the converging condition. The light is finally emitted from the output end 14b of the guide portion 14.

According to the above converging device, the number of reflections of the light in the duct portion 12 can be reduced by introducing the light reaching the reflective surface 12b in the guide portion 14. Thus, the light reaches the vertex of the duct portion 12 before the incident angle of the light in the reflective surface 12b becomes smaller than the critical angle of the total reflection. Therefore, the light having a large aspect ratio, which is emitted from the LD bar 16 or the like, can be converged to a smaller spot.

In addition, because of the difference in a refractive index between the duct portion 12 and the guide portion 14, the angle between the light path in the guide portion 14 and an optical axis of the guide portion 14 decreases. Therefore, since the divergent angle of the light finally emitted from the output end 14b of the guide portion 14 can be reduced, the light can be converged to a smaller spot.

Figure 13:
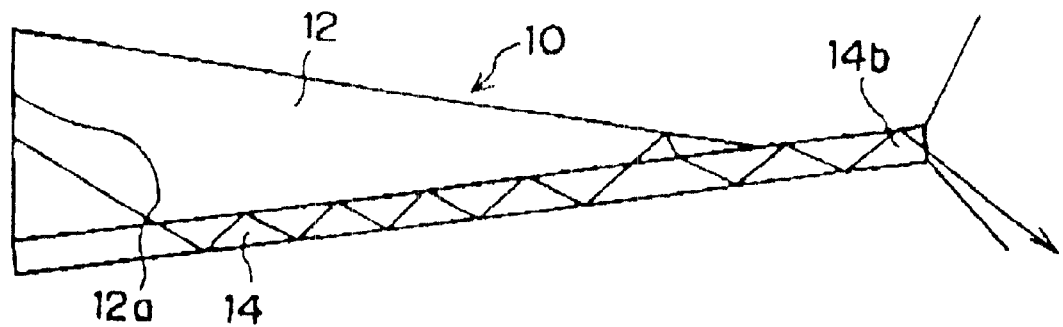
FIG. 13 is a plan view showing a function of the converging device of the present invention.

Next, the function of the converging device 10 in which the guide portion 14 has a larger refractive index than the duct portion 12 is described, referring to FIG. 13. The light is input from the incident surface 12a to the duct portion 12. The light is introduced from the duct portion 12 to the guide portion 14. The light, because of the difference in refractive index between the guide portion 14 and the duct portion 12, travels toward the vertex, by repeating the reflection in the boundary of the guide portion 14 an duct portion 12. In this case, the light introduced in the guide portion 14 tends to be confined in the guide portion 14, and once the light is introduced in the guide portion 14, the light never or seldom travels in the duct portion 12. Therefore, the number of reflections of the light in the duct portion 12 can be reduced. In addition, as the light tends to be confined in the guide portion 14, energy density in the duct portion 12 can be reduced, and the duct portion 12 can be made of, for example, resin having a low heat resistance.

Figure 14:
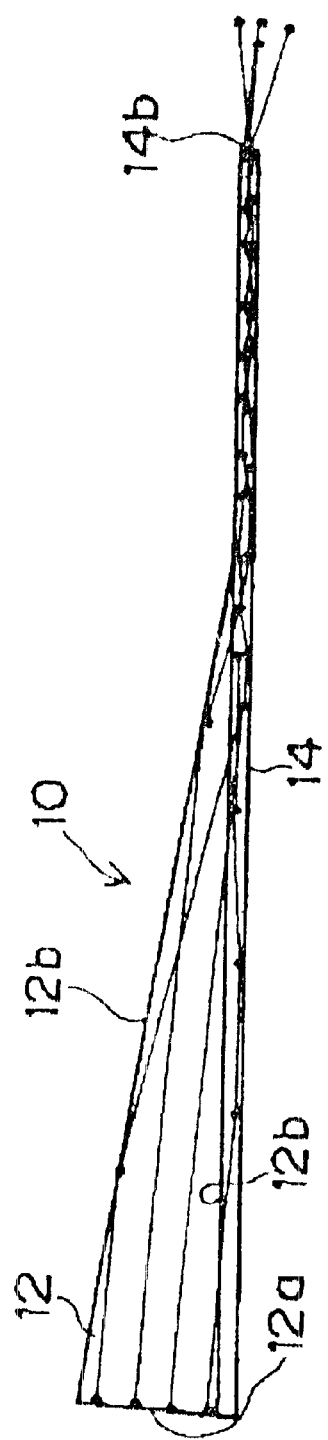
FIG. 14 is a plan view showing a light path in the converging device of the present invention which is analyzed by a ray-tracing method.

FIG. 14 shows light paths of the light converged by the converging device 10 of the present invention, which is analyzed by a ray-tracing method. The converging device used in the FIG. 14 has an equilateral triangle duct portion 12 made of silica glass having a thickness of 100 μm, a vertex angle of 10°, and a width of the incident surface of 12 mm. The converging device 10 has the guide portion provided in the reflective surface 12b which is made of silica glass and having a diameter of 2 mm. Four parallel light beams at 3 mm pitch are introduced in the converging device. As can be seen from FIG. 14, the light introduced from the incident surface 12a to the duct portion 12 is transmitted in the duct portion 12 and guide portion 14 toward the vertex of the duct portion 12 and finally emitted from the output end 14b of the guide portion 14 with a small divergent angle.

Hereinafter, variations of the first embodiment will be described. In the following description, the same features as those previously described will be denoted by the same reference numerals and the detailed description thereof will be omitted.

Figure 15:
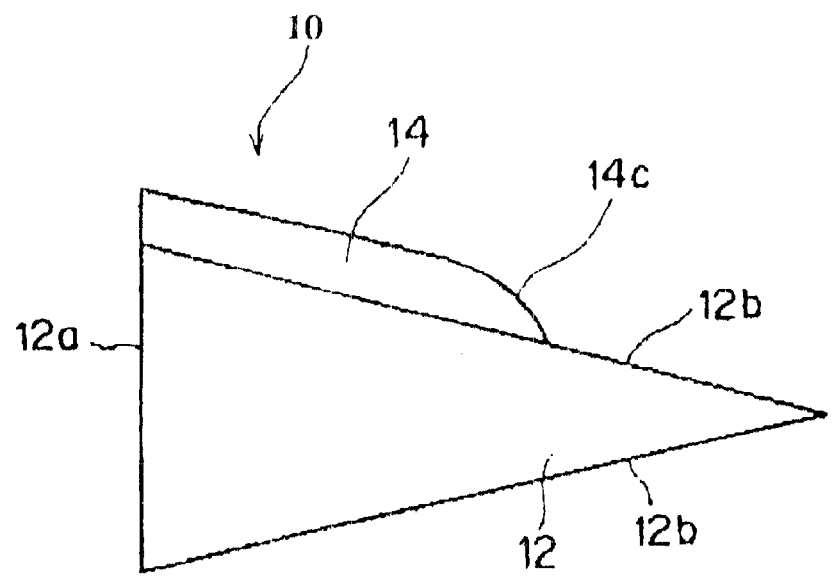
FIG. 15 is a plan view showing a first variation of the first embodiment of the present invention.

FIG. 15 shows a first variation of the first embodiment. In this converging device 10, the guide portion 14 is provided along a part of the reflective surface 12b of the duct portion 12. In one end of the duct portion in the vertex side, a tapered surface 14c whose diameter is gradually decreasing toward the vertex direction is provided. The light transmitted in the guide portion 14 is reflected in the tapered surface 14c to be returned to the duct portion 12. The light returned to the duct portion 12 travels by being reflected in the reflective surface 12b and is finally emitted from the vertex of the duct portion 12. In a converging device in which the converged light is emitted from the duct portion instead of the guide portion, a flat cut surface may be formed at the tip or vertex portion for emitting the converged light.

According to the converging device 10, since the light transmitted in the duct portion 12 is introduced in the guide portion 14, the number of reflections in the duct portion 12 can be reduced. Also, by returning the light transmitted in the guide portion 14 to the duct portion 12, the converged light can be input from the vertex of the duct portion 12.

Figure 16:
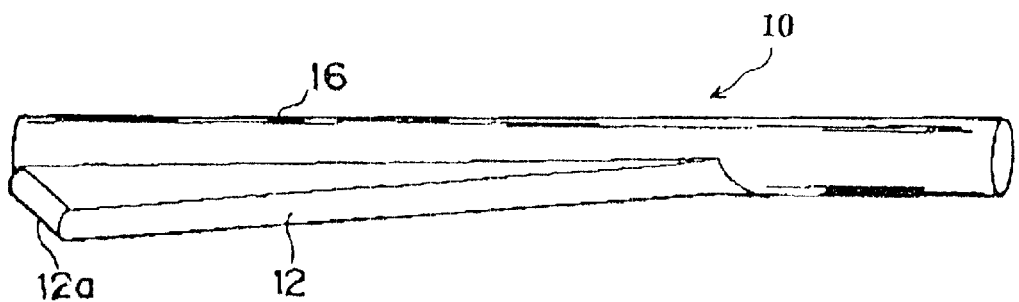
FIG. 16 is a perspective view showing a second variation of the first embodiment of the present invention.

FIG. 16 shows a second variation of the first embodiment. In this converging device 10, a convex surface in the vertical direction is formed in the incident surface 12a. By this structure, the light introducing efficiency can be improved. The convex surface may be formed in the upper surface 12c, the lower surface 12d and the reflective surface 12b.

Figure 17:
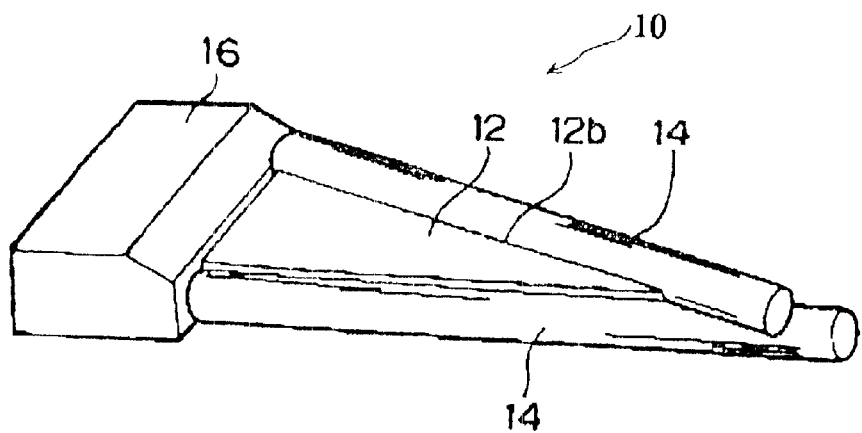
FIG. 17 is a perspective view showing a third variation of the first embodiment of the present invention.
Figure 18:
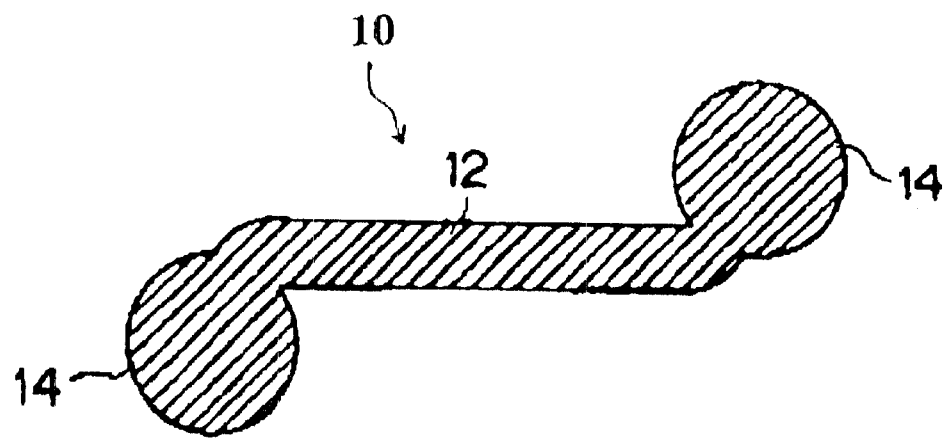
FIG. 18 is a sectional view showing the third variation of the first embodiment of the present invention.

FIGS. 17 and 18 show a third variation of the first embodiment. In this converging device 10, the guide portion 14 is provided along both reflective surfaces 12b. By this structure, the number of reflections in the duct portion 12 and the divergent angle of the emitted light can be reduced. Also, a length of the duct portion 12 can be reduced. In this variations, two guide portions 14 are preferably provided with vertical space therebetween so that the guide portions 14 do not intersect.

Figure 19:
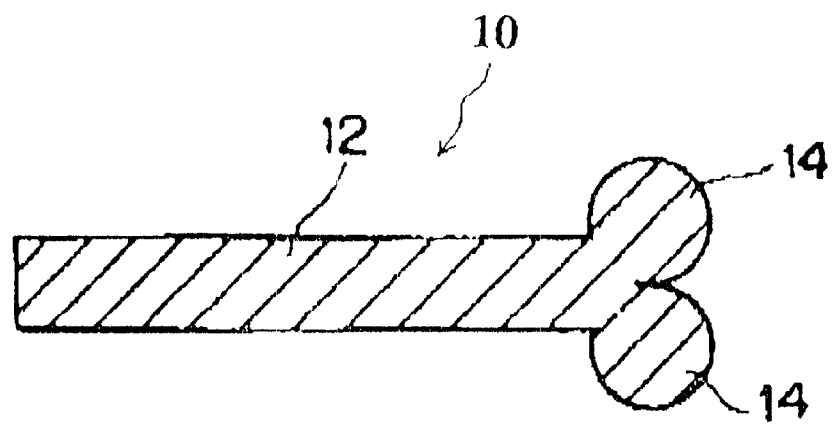
FIG. 19 is a sectional view showing a fourth variation of the first embodiment of the present invention.

FIG. 19 shows a fourth variation of the first embodiment. In this converging device 10, two guide portions 14 are provided on the reflective surface 12b. By this structure, the number of reflections in the duct portion 12, the divergent angle of the emitted light and the length of the duct portion 12 can be reduced, as well as in the third embodiment.

Figure 20:
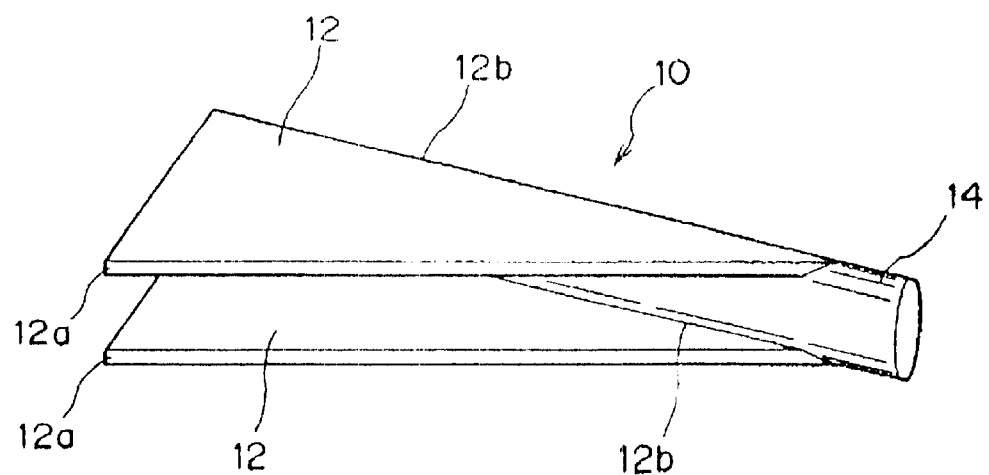
FIG. 20 is a perspective view showing a fifth variation of the first embodiment of the present invention.

FIG. 20 shows a fifth variation of the first embodiment. In this converging device 10, two duct portion 12 are connected by one guide portion 14. By this structure, high power light can be converged. A plurality of converging devices of this variation can be stacked vertically with respect to the LD bar 16, as shown in FIG. 21.

The converging device of the present embodiment is not limited to those described above, however, various modification may be made. For example, the duct portion has an equilateral triangle shape in the above description, however, the shape of the duct portion 12 is not limited as long as the duct portion has a tapered shape from the incident surface to the tip portion. The duct portion may be formed in a cone shape or an elliptic cone shape, in which a bottom surface is an incident surface and a side surface connecting the bottom surface and the tip portion is a reflective surface. Alternatively, the duct portion may have a right-angled triangle shape having a right angel in the base or trapezoid shape. The thickness of the duct portion may be increasing from the incident surface to the vertex or decreasing at a position where the guide portion is connected.

Figure 23:
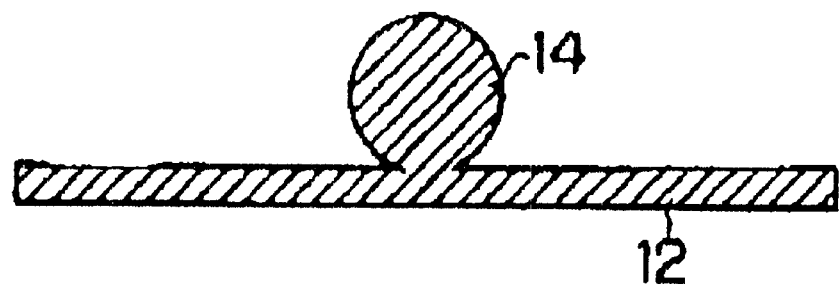
FIG. 23 is a sectional view showing the converging device in which the guide portion is provided along the center of the duct portion.

Also, in the above converging device 10, the guide portion is provided in the reflective surface 12b. However, a position of the guide portion is not limited to that of the above description as long as the light is introduced and transmitted in the guide portion. The guide portion 14 maybe provided along the longitudinal center line in the upper surface 12c of the duct portion 12, as shown in FIGS. 22 and 23.

Further, in the above converging device 10, the guide portion is made in the shape of a fiber. However, the guide portion is made by a refractive-index dispersion formed in the duct portion. Such a refractive-index dispersion may be formed by adding a dopant which increase or decrease the refractive index in a desired area of the duct portion.

Hereinafter, a converging device of other embodiments will be described.

Figure 24:
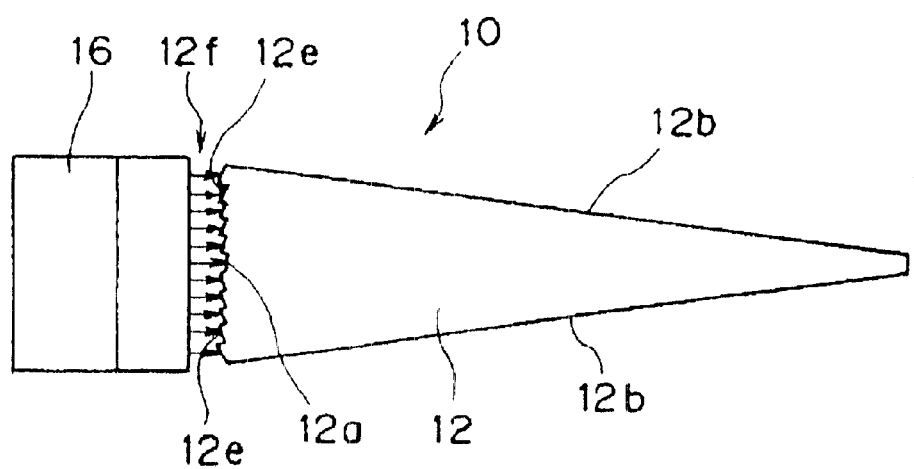
FIG. 24 is a plan view showing a second embodiment of a converging device according to the present invention.
Figure 25:
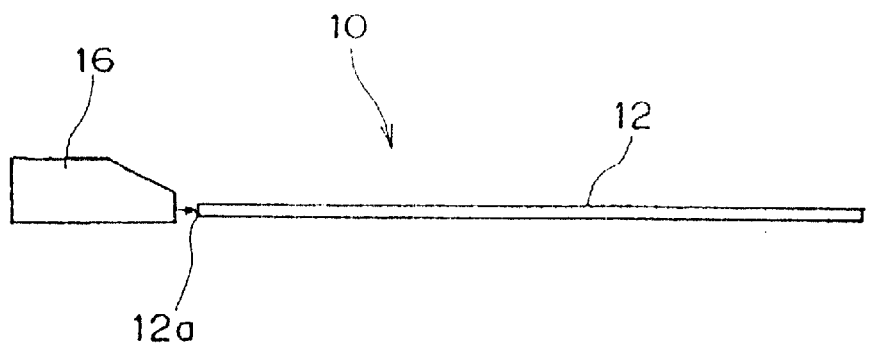
FIG. 25 is a side view showing the second embodiment of the converging device according to the present invention.

FIGS. 24 and 25 show a converging device of a second embodiment of the present invention. In the converging device 10, a plurality of microlenses 12e are continuously aligned in the incident surface 12a to form a lens surface 12f, which is similar to a Fresnel lens. The lens surface 12f can reduce the number of reflections of the light in the duct portion 12 by refracting the introduced light toward the vertex of the duct portion 12. Each microlens 12e constituting the lens surface 12f normally faces each one or a plurality of laser diodes constituting the light emitting surface of the LD bar 16. Such a converging device may be produced by cutting the incident surface 12a of the duct portion 12 with a carbon dioxide laser beam or the like or polishing the incident surface 12a. In the converging device not having the guide portion 14 like the above-described structure, the converged light is emitted from either the vertex of the duct portion or a broken surface formed in the vertex.

According to the converging device 10, the number of reflections of the light in the duct portion 12 can be reduced by the lens surface 12f formed in the incident surface 12a. Therefore, the light can be transmitted to the vertex of the duct portion 12 before the incident angle of the light to the reflective surface 12b becomes smaller than the critical angle of the total reflection. Also, a curvature of the incident surface 12a can be set to be smaller than the conventional triangle duct having one convex surface in the incident surface 12a, which enables reduction of the amount of leakage of the light at both edges of the incident surface 12a. Therefore, the light from the LD bar 16 or the like can be more efficiently converged to a small spot by the converging device 10.

Figure 26:
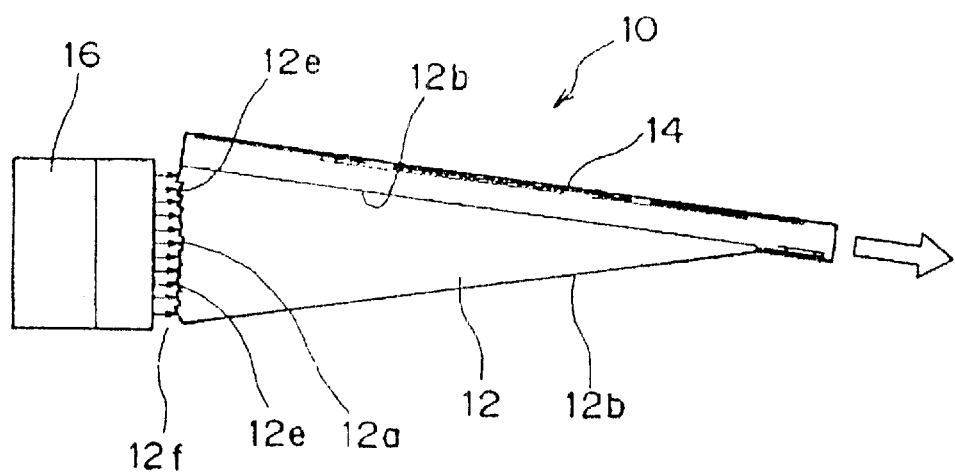
FIG. 26 is a plan view showing a variation of the second embodiment of the converging device according to the present invention.
Figure 27:
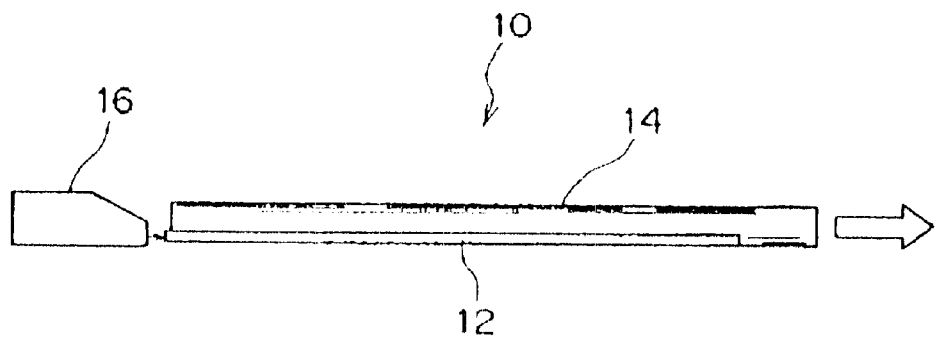
FIG. 27 is a side view showing the variation of the second embodiment of the converging device according to the present invention.

FIGS. 26 and 27 show a variation of the second embodiment. In the converging device 10, the guide portion 14 is provided on the reflective surface 12b of the duct portion 12. According to the variation, the light from the LD bar or the like can be converged more efficiently by utilizing both the lens surface 12f and the guide portion 14.

Figure 28:
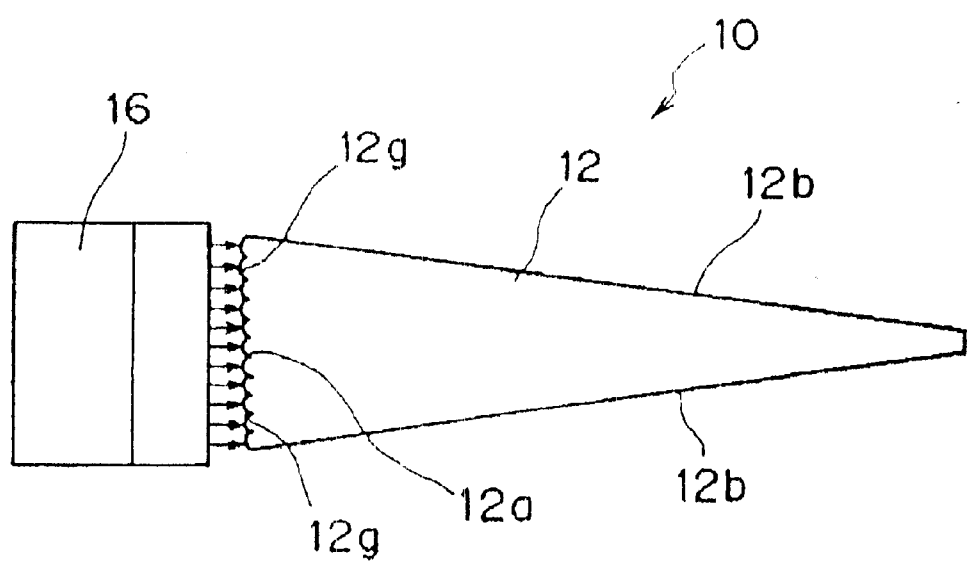
FIG. 28 is a plan view showing a third embodiment of a converging device according to the present invention.
Figure 29:
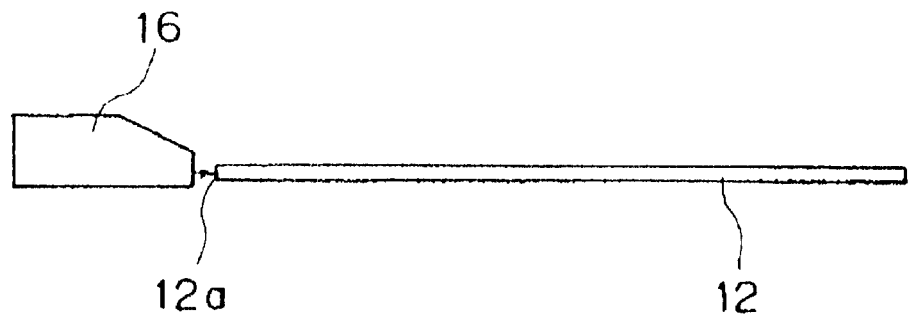
FIG. 29 is a side view showing the third embodiment of the converging device according to the present invention.

FIGS. 28 and 29 show a converging device of a third embodiment of the present invention. In the converging device 10, a plurality of microlenses 12g are continuously aligned in the incident surface 12a to form a microlens array. The microlens 12g can reduce the number of reflections of the light in the duct portion 12 by refracting the introduced light toward the vertex of the duct portion 12.

Each microlens 12g normally faces each one or a plurality of laser diodes constituting the light emitting surface of the LD bar 16. The microlens can refract the light from the LD bar 16 toward the vertex of the duct portion 12 to reduce the number of reflections between the reflective surfaces 12b.

Such a converging device 10, likewise as in the second embodiment, may be produced by cutting the incident surface 12a of the duct portion 12 with a carbon dioxide laser beam or the like or polishing the incident surface 12a.

According to the converging device 10, the number of reflections of the light in the duct portion 12 can be reduced by the microlens 12g formed in the incident surface 12a. Therefore, the light can be transmitted to the vertex of the duct portion 12 before the incident angle of the light to the reflective surface 12b becomes smaller than the critical angle of the total reflection. Also, the leakage of the light at both edges of the incident surface 12a can be reduced. Therefore, the light from the LD bar 16 or the like can be more efficiently converged to a small spot by the converging device.

Figure 30:
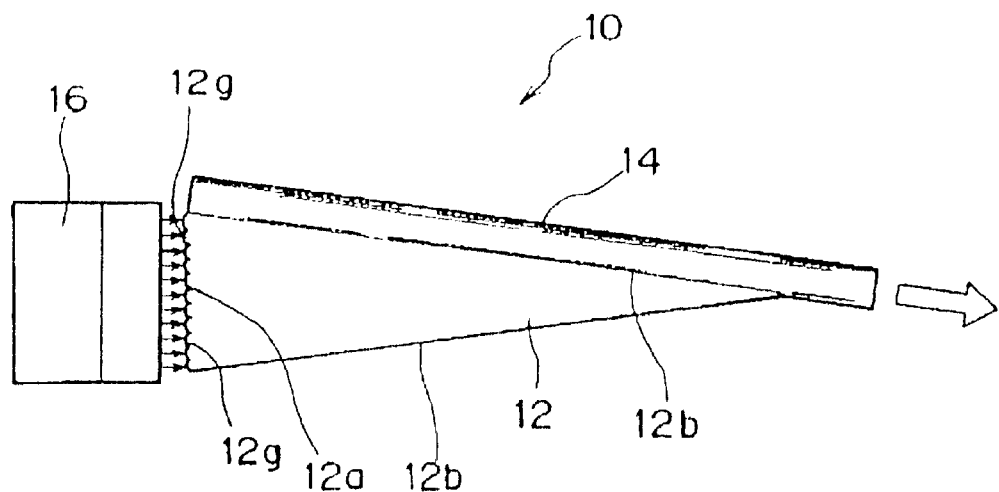
FIG. 30 is a plan view showing a variation of the third embodiment of the converging device according to the present invention.
Figure 31:
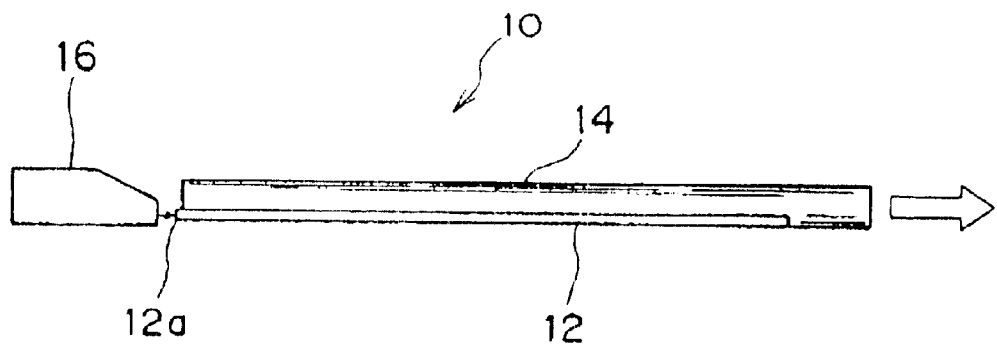
FIG. 31 is a side view showing the variation of the third embodiment of the converging device according to the present invention.

FIGS. 30 and 31 show a variation of the third embodiment. In the converging device 10, the guide portion 14 is provided in the reflective surface 12b of the duct portion 12. According to the variation, the light from the LD bar or the like can be converged more efficiently by utilizing both the microlens 12g and the guide portion 14.

Figure 32:
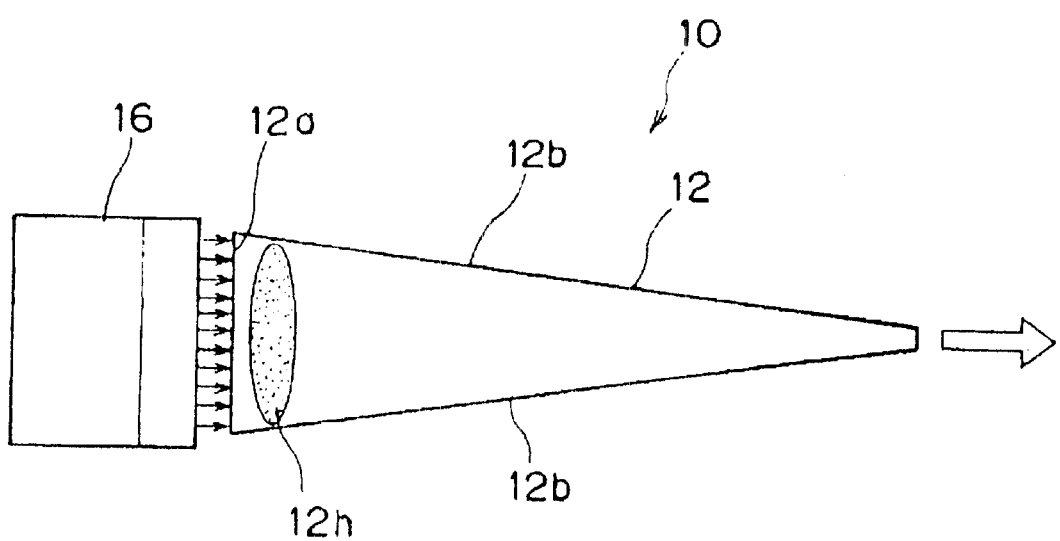
FIG. 32 is a plan view showing a fourth embodiment of a converging device according to the present invention.

FIGS. 32 and 33 show a converging device of a fourth embodiment of the present invention. The converging device 10 has a duct portion 12 and a refractive portion 12h formed therein in a unitary body. The refractive portion 12h may be made in a cylindrical lens shape by an optically transparent material such as glass and resin, with respect to the light to be converged which has a different refractive index from the duct portion 12. The refractive portion 12h is normally formed adjacent the incident surface 12a in unitary body with duct portion 12, the light from the LD bar 16 can be refracted toward the vertex or output end of the duct portion 12 to reduce the number of reflections in the reflective surface 12b.

Such a converging device 10 can be produced by forming an opening having a shape corresponding to that of the refractive portion 12h, filling the opening with softened glass or resin and then harden the glass or resin.

According to the converging device 10, the number of reflections of the light in the duct portion 12 can be reduced by the refractive portion 12h. Therefore, the light can be transmitted to the vertex of the duct portion 12 before the incident angle of the light to the reflective surface 12b becomes smaller than the critical angle of the total reflection. Also, since the position of the refractive portion 12h can be accurately adjusted during a production process and the light is operated when the light is confined, a converging device with improved coupling efficiency can be provide.

Further, since the refraction of the light is carried out by the refractive portion 12h instead of the incident surface 12a, the incident surface 12a maybe formed in a flat shape. Thus, the leakage of the light can be reduced in both edges of the incident surface 12a. In addition, the converging device 10 can be produced easily without forming a complex shape in the incident surface 12a. Moreover, in the incident surface 12a, a convex face in the thickness direction maybe formed in order to refract the light in the thickness direction of the duct portion 12.

The above embodiment is not limited to those described above, but various variations can be made. For example, the shape of the refractive portion is not limited to the above description. In fact, as long as the refractive portion can refract the light from the LD bar toward the light emitting end of the duct portion 12, any alternative shape is acceptable. The refractive portion may be made as a Fresnel lens or a microlens array shape, in which each microlens faces the laser diode of the LD bar. Also, the guide portion 14 can be provided in the reflective surface 12b of duct portion 12, as in the second and third embodiments.

Hereinafter, laser devices of the present invention will be described.

FIG. 34 shows a laser device of a first embodiment of the present invention. The laser device 20 is a light oscillation or amplification device utilizing a stimulated emission effect of a laser medium. The laser device 20 can be utilized in a laser processing, optical communications, laser measurement or the like.

The laser device 20 includes the LD bar 16 as a pumping source, the converging device 10 for converging a pumping light from the LD bar 16, an optical member 22 having a cylindrical shape in which the pumping light converged by the converging device 10 is confined, a cylinder 22a as a core of the optical member 22 and an optical fiber 24 wound around the optical member 22.

The cylinder 22a has a metal surface having a high reflectance, which is coated with a resin having a low refractive index.

The optical member 22 is made of a material which is optically transparent with respect to the pumping light from the LD bar 16. The introduced pumping light is confined in the optical member 22 by reflection. The optical member 22 is produced in a manner such that a glass sheet such as silica glass and phosphate glass, plastic, optical crystal and the like is wound around the cylinder 22a. In the optical member 22, the pumping light is confined by a total reflection due to the difference in a refractive index between the optical member 22 and an outer circumstance, usually air. However, the pumping light may be confined by a reflection due to a reflective coating having a high reflectance provided in the optical member 22. The optical member 22 maybe formed in a cylindrical shape, a circular plate shape, a lens shape or the like.

The optical fiber 24 is wound in the optical member 22 directly or via an optical medium. As the optical medium, an optical resin or the like is used, which does not interfere with the introduction of the pumping light from the optical member 22 to the optical fiber 24.

As the optical fiber 24, a laser fiber is used, which includes a core doped with a laser medium and a cladding formed around the core. The laser medium generates the laser beam by a stimulated emission effect due to the pumping light. As the laser medium, rare earth metals such as neodymium (Nd), ytterbium (Yb) and erbium (Er) or the like may be used, depending upon the uses of the laser device 20.

In the laser device 20 of the present invention, one end 24a of the optical fiber 24 is normally polished to a flat surface and then coated with a multilayer coating, as a reflective end. The reflective end is fixed to the optical member 22. The other end 24b of the optical member 22 has a vertical broken end which is not provided with a coating, as an output end. The out put end is pulled out from the laser device 20. When the one end 24a of the optical fiber 24 is used as an input end of the signal and the other end 24b is used as an output end of the signal, or when the both ends 24a, 24b are used as the output ends of the laser beam, the both ends 24a, 24b are made to be the vertical broken surface and pulled out. In the vertical broken ends, an antireflective layer may be provided, when necessary.

The output end of the converging device 10 is connected to one end of an optical fiber 26, and the other end of the optical fiber 26 is connected by welding to an upper end face of the optical member 22 at a certain angle. As the converging device 10, one of the converging devices 10 previously described can be utilized. The output end of the converging device 10 can be directly connected to the upper end face of the optical member 22 for introducing the light from the guide portion 14 to the optical member 22.

In the laser device, when the light emitting surface of the LD bar 16 is placed adjacent the incident surface 12a of the converging device 10, the pumping light from the LD bar 16 is introduced in the converging device 10. The pumping light is converged in the converging device 10 and emitted from the output end of the converging device 10 as a converged pumping light having a small spot.

The pumping light is introduced to the optical member 22 from its upper end face via the optical fiber 26. The light is repeatedly reflected between an upper surface and a bottom surface of the optical member 22, and travels toward the lower end of the optical member 22 along a spiral light path in the optical member 22. At this time, since the surface of the cylinder 22a is coated with a resin having a low refractive index, the light introduced in the optical member 22 can be easily confined in the optical member 22. Also, since the cylinder 22a has a surface made of a reflective metal, the light leaked from the bottom face of the optical member 22 is reflected in the surface of the cylinder 22a to be returned to the optical member 22.

When the pumping light is transmitted to the optical member 22 in which the optical fiber 26 is provided, the pumping light is introduced to the optical fiber 26 from its lateral side. The pumping light introduced in the optical fiber 24 stimulates the laser medium doped in the core of the optical fiber 24 to generate a laser beam by a stimulated emission effect. The laser beam is transmitted in the optical fiber 24 and output from the output end 24b of the optical fiber 24.

According to the laser device 20, since a light converged to the small spot with a high energy density is used as the pumping light, the pumping light can be introduced to the optical member 22 from its small area. As a result, the light introduced to the optical member 22 tends not to be leaked from its introducing portion, which improves a laser oscillation efficiency. Also, since the pumping light can be introduced to the optical member 22 from its small introducing area, radiation of the pumping light can be limited in a small range and large amount of pumping light can be introduced to the optical member 22. Therefore, a laser device with a high output power can be provided.

Figure 35:
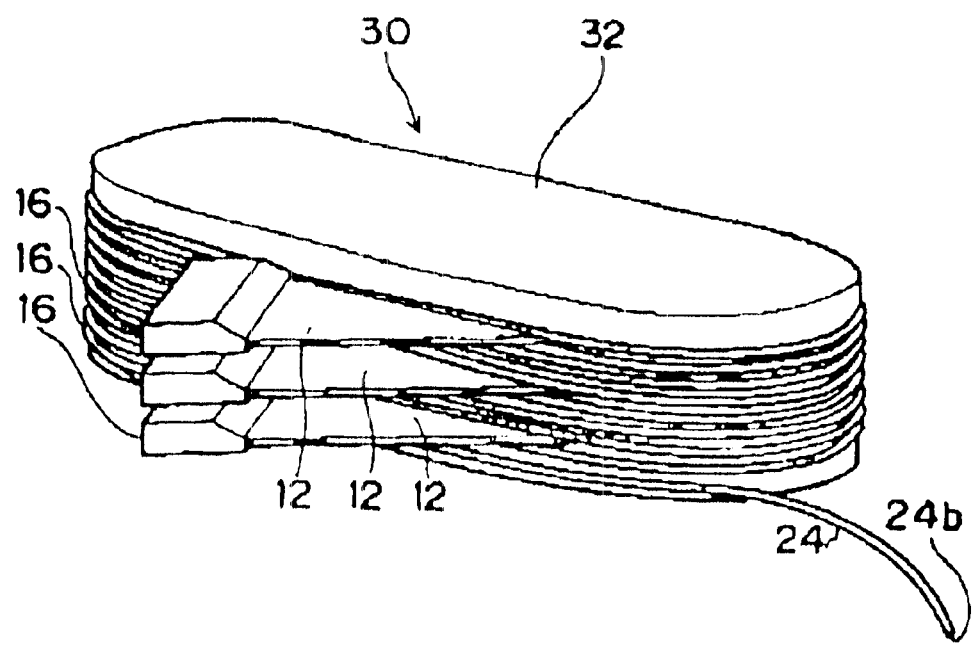
FIG. 35 is a perspective view showing a second embodiment of a laser device according to the present invention.

Next, a laser device of a second embodiment of the present invention is described. FIG. 35 shows a laser device 30. The laser device 30 includes the LD bar 16 as a pumping source, the duct portion 12 for converging a pumping light from the LD bar 16, the optical fiber 24, and a supporting member 32 for supporting the optical fiber 24.

The supporting member 32 has a cylindrical shape having a long circular cross-section. A surface of the supporting member 32 is made of metallic material having a high reflectance, which is coated with a resin having a low refractive index.

Figure 36:
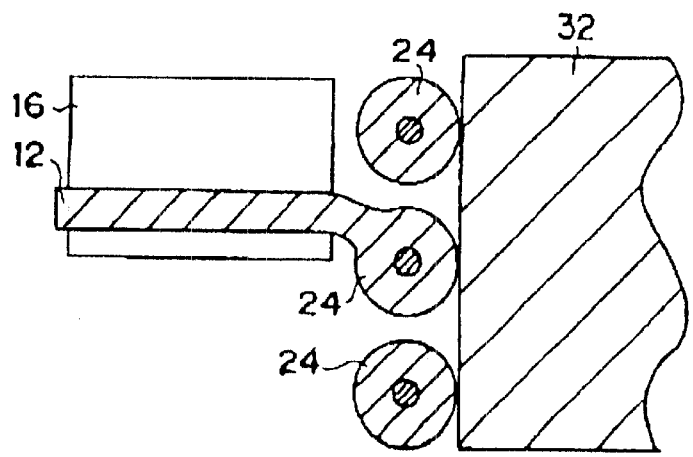
FIG. 36 is a sectional view showing a connection between a duct portion and an optical fiber.
Figure 37:
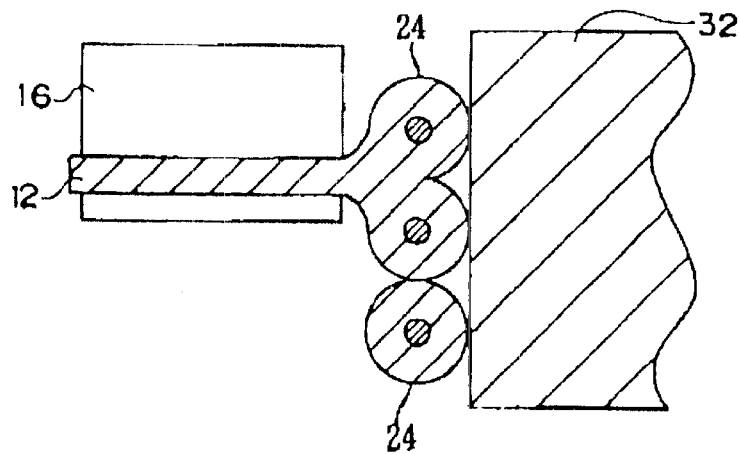
FIG. 37 is a sectional view showing another example of the connection between the duct portion and the optical fiber.

The optical fiber 24 is wound in a side surface of the supporting member 32. In the straight portion of the optical fiber 24 wound in the supporting member 32, three duct portions 12 are provided vertically at a certain distance. As the duct portion 12, the above-described converging device 10 which does not have the guide portion 14 is preferably used. The duct portion 12 is fixed in the optical fiber 24 in a manner in which the reflective surface 12a of the duct portion 12 is connected by being melted to the optical fiber 24, i.e., heat bonding of the surfaces. In this case, the reflective surface 12a of the duct portion 12 may be connected to the optical fiber 24 at one position as shown in FIG. 36, or the reflective surface 12a may be connected at two positions to the neighboring two optical fibers 24 as shown in FIG. 37.

In the laser device 30, when the light emitting surface of the LD bar 16 is placed adjacent the incident surface 12a of the duct portion 12, the pumping light from the LD bar 16 is introduced in the duct portion 12. The introduced pumping light travels toward the vertex of the duct portion 12.

When the pumping light reaches the reflective surface 12b in which the optical fiber 24 is provided, the pumping light is introduced to the optical fiber 24 from its lateral side. The pumping light introduced in the optical fiber 24 stimulates the laser medium doped in the core of the optical fiber 24 to generate a laser beam by a stimulated emission effect. The laser beam is transmitted in the optical fiber 24 and output from the output end 24b of the optical fiber 24.

According to the laser device 30, since the converged light is used for generating the laser beam, the laser oscillation efficiency can be improved. Also, since the pumping light can be directly introduced from the duct portion 12 to the optical fiber 24, radiation of the pumping light can be limited within a small range.

Figure 38:
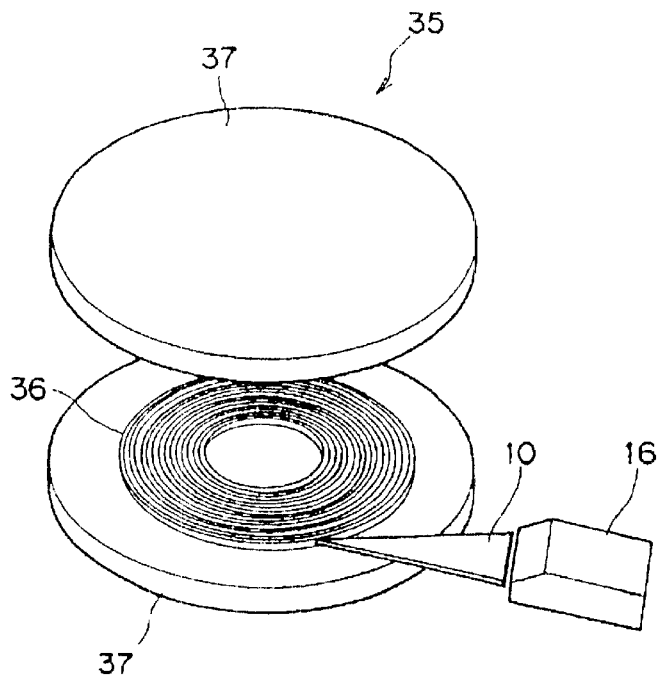
FIG. 38 is a perspective view showing a third embodiment of a laser device according to the present invention.

Next, a laser device of a third embodiment of the present invention is described. FIG. 38 shows the laser device 35. The laser device 35 includes the LD bar 16 as a pumping source, the converging device 10 for converging a pumping light from the LD bar 16, an optical fiber member 36, and cooling members 37 for cooling the optical fiber member 36.

Figure 39:
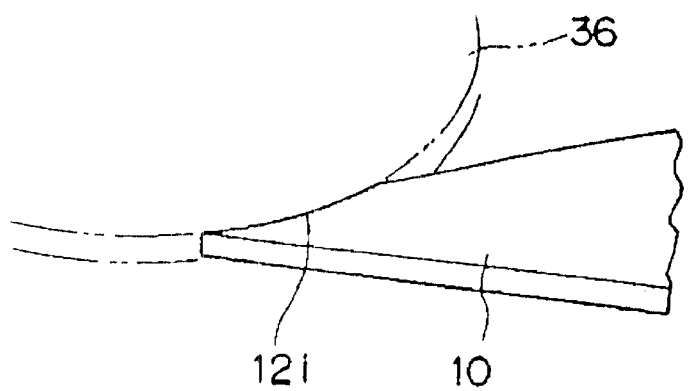
FIG. 39 is a perspective view showing a connection between an optical fiber and a converging portion.
Figure 40:
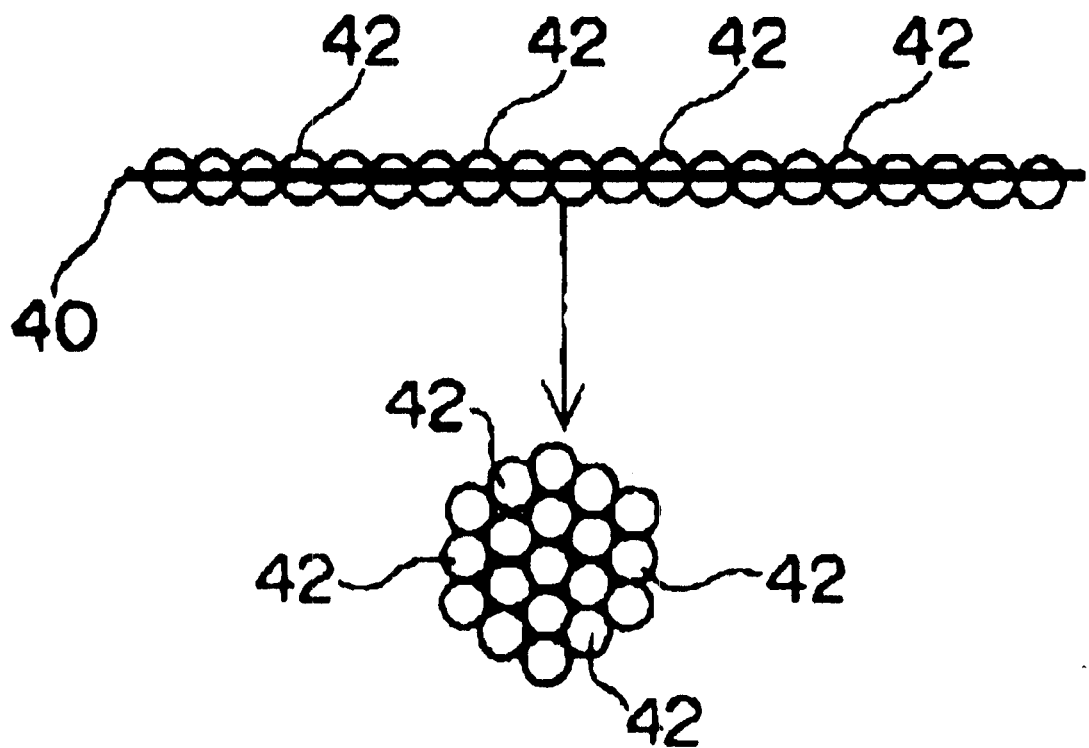
FIG. 40 is a schematic view showing a conventional converging device of a fiber coupling system.
Figure 4:
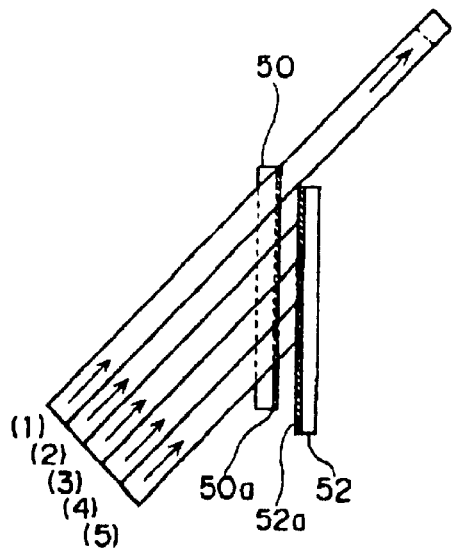
Figure 4:
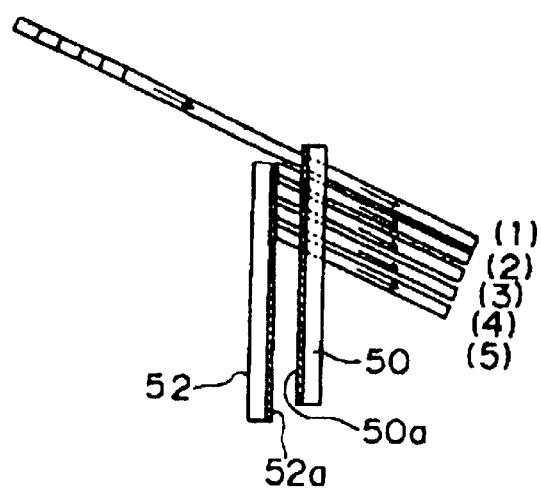
Figure 43:
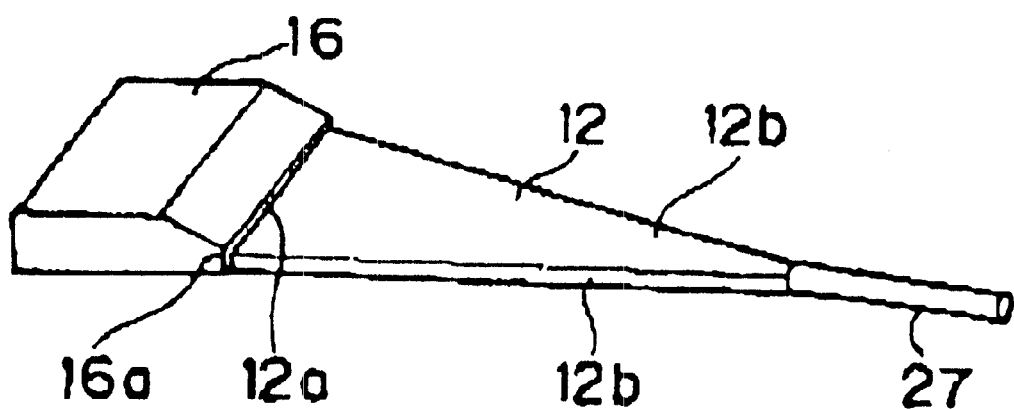
FIG. 43 is a perspective view showing a conventional triangle duct.
Figure 44:
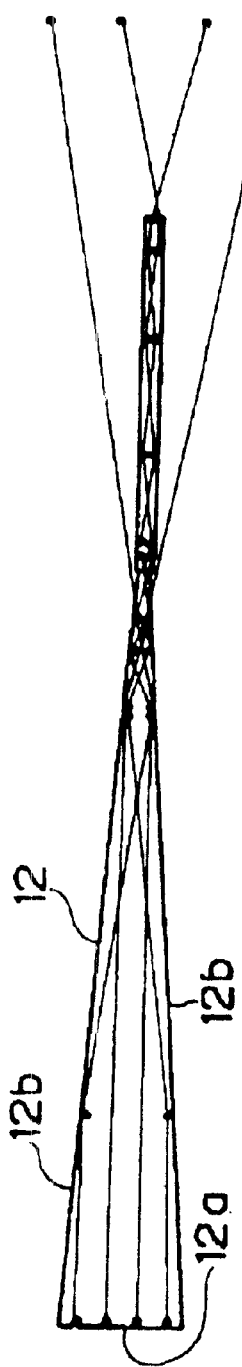
FIG. 44 is a plan view showing a light path in the conventional triangle duct which is analyzed by a ray-tracing method.
Figure 45:
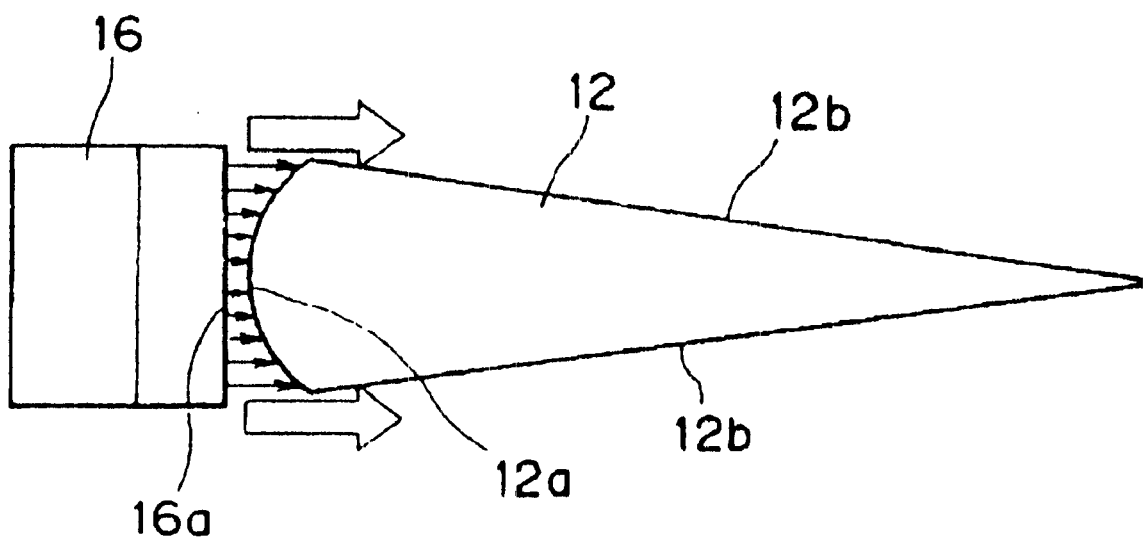
FIG. 45 is a plan view showing another example of the conventional triangle duct.

The optical fiber member 36 has a circular plate shape in which the optical fiber 24 is wound. In the side face of the optical fiber member 36, the converging device 10 is provided. As the converging device 10, the above-described converging device 10 which is not provided with the guide portion 14 can be preferably used. In the reflective surface 12b of the converging device 10, a connecting portion 12i having a recess shape corresponding to the outer edge of the optical fiber member 36 is provided, as shown in FIG. 39. The optical fiber member 36 can be connected to the reflective surface 12b of the converging device 10 without forming a gap.

The cooling member 37 has a circular plate shape, and is made of a metallic material. The optical fiber member 36 is fixed between the cooling members 37 so that the heat generated by the optical fiber member 36 can be radiated by the cooling members 37.

In the laser device 30, when the light emitting surface of the LD bar 16 is placed adjacent the incident surface 12a of the duct portion 12, the pumping light from the LD bar 16 is introduced in the duct portion 12. The introduced pumping light is transmitted toward the vertex of the duct portion 12. The pumping light is introduced to the optical fiber member 36 through the connecting portion 12i of the duct portion 12.

The pumping light introduced in the optical fiber member 36 is transmitted across the optical fiber 24. The pumping light stimulates the laser medium doped in the core of the optical fiber 24 to generate a laser beam by a stimulated emission effect. The laser beam is transmitted in the optical fiber 24 and output from the output end 24b of the optical fiber 24.

According to the laser device 30, since the converged light is used for generating the laser beam, the laser oscillation efficiency can be improved. Also, since the pumping light can be directly introduced from the duct portion 12 to the optical fiber 24, radiation of the pumping light can be limited within a small range.

Hereinafter experimental examples of the present invention will be described.

A. Convergence by a Converging Device

EXAMPLE 1

By utilizing a computer-controlled stage and a carbon dioxide laser, a thin plate having a shape of an equilateral triangle with a thickness of 100 $\mu$m, a vertex angle of 10°, and a length of a base side of 12 mm is made by a silica glass having a refractive index of 1.458. Each surface of the thin plate is optically polished to provide a duct portion 12. By irradiating a carbon dioxide laser beam to one of the reflective surfaces 12b, a guide portion 14 of a fiber shape having a diameter of approximately 500 $\mu$m is formed in the reflective surface 12b of the duct portion 12. Antireflective coatings are provided to the incident surface 12a and the output surface of the guide portion 14 so as to provide a converging device 10 of the type shown in FIGS. 1 and 2.

As a light source, a LD bar is used in which 19 laser diodes are aligned in a straight line at 500 $\mu$m pitch. The LD bar has a light emitting surface having a thickness of several micrometers and a width of approximately 9 mm.

The light from the LD bar 16 is introduced to the converging device 10 in such a manner that the incident surface 12a of the converging device 10 is placed adjacent the light emitting surface 16a of the LD bar 16 at a distance of 50 $\mu$m, as shown in FIG. 8. The amount of light emitted from the output end 14b of the guide portion 14 is measured to obtain a coupling efficiency.

EXAMPLE 2

Two duct portions 12 of the type provided in the EXAMPLE 1 are connected with a silica glass ribbon having a width of 1 mm and a thickness of 0.3 mm. Antireflective coatings are provided to the incident surface 12a of the duct portion 12 and the output end of the silica glass ribbon to provide the converging device 10 of the type shown in FIG. 20.

A light source in which four LD bars are stacked vertically at 1 mm pitch are used. Each LD bar in the light source has 19 laser diodes aligned in a straight line at 500 $\mu$m pitch, and has a light emitting surface having a thickness of several micrometers and a width of approximately 9 mm.

The incident surfaces 12a of the two converging devices 10 are placed adjacent the light emitting surfaces of the LD bars 16 at a distance of 50 $\mu$m, as shown in FIG. 21. The amount of light emitted from the two silica glass ribbons is measured to obtain a coupling efficiency.

EXAMPLE 3

By utilizing a computer-controlled stage and a carbon dioxide laser, 19 microlens are formed at 500 mm pitch in the incident surface 12a of the duct portion 12 provided in EXAMPLE 1 to form a lens surface similar to a Fresnel lens. In the above duct portion, a cut surface having a width of 0.5 mm is formed as an output end at the vertex portion. Antireflective coatings are provided to the incident surface 12a and the output end so as to provide a converging device 10 of the type shown in FIGS. 24 and 25.

As a light source, a LD bar of the type used in EXAMPLE 1 is used. The light from the LD bar 16 is introduced to the converging device 10 in the same manner as that of EXAMPLE 1 except that each laser diode faces each of the microlens, in order to obtain a coupling efficiency.

EXAMPLE 4

By utilizing a computer-controlled stage and a carbon dioxide laser, 19 microlens are formed at 500 $\mu$m pitch in the incident surface 12a of the duct portion 12 provided in EXAMPLE 1 to form a lens surface similar to a Fresnel lens.

By irradiating a carbon dioxide laser beam to one of the reflective surfaces 12b of the duct portion 12, a guide portion 14 is provided having a fiber shape with a diameter of approximately 450 $\mu$m. Antireflective coatings are provided to the incident surface 12a and the output surface of the guide portion 14 so as to provide a converging device 10 of the type shown in FIGS. 26 and 27. The convergence using the converging device 10 is conducted to obtain a coupling efficiency in the same manner as that of EXAMPLE 3.

EXAMPLE 5

By utilizing a computer-controlled stage and a carbon dioxide laser, 19 microlens are formed at 490 $\mu$m pitch in the incident surface 12a of the duct portion 12 as provided in EXAMPLE 1 to form a microlens array. In the above duct portion 12, a cut surface having a width of 0.5 mm is formed as an output end at the vertex portion. Antireflective coatings are provided to the incident surface 12a and the output end of the duct portion 12 so as to provide a converging device 10 of the type shown in FIGS. 28 and 29.

The convergence is performed to obtain a coupling efficiency in the same manner as that of EXAMPLE 3.

EXAMPLE 6

By utilizing a computer-controlled stage and a carbon dioxide laser, 19 microlens are formed at 490 $\mu$m pitch in the incident surface 12a of the duct portion 12 provided in EXAMPLE 1.

By irradiating a carbon dioxide laser beam to one of the reflective surfaces 12b of the duct portion 12, a guide portion 14b is provided having a fiber shape with a diameter of approximately 450 $\mu$m. Antireflective coatings are provided to the incident surface 12a and the output surface of the guide portion 14 so as to provide a converging device 10 of the type shown in FIGS. 30 and 31. The convergence using the converging device 10 is conducted to obtain a coupling efficiency in the same manner as that of EXAMPLE 3.

EXAMPLE 7

In the duct potion of the type provided in the EXAMPLE 1, a hole is formed having a cylindrical lens shape. The hole is filled with a UV hardening resin having a refractive index of approximately 1.5. The UV hardening resin is hardened to form the refractive portion 12h having a radius of curvature of 6 mm, a lens width of 11 mm and a thickness of center portion of 15 mm. The distance between the refractive portion and incident surface 12a is approximately 2 mm. In the above duct portion 12, a cut surface having a width of 0.5 mm is formed as an output end at the vertex portion. Antireflective coatings are provided to the incident surface 12a and the output end of the duct portion 12 so as to provide a converging device 10 of the type shown in FIGS. 32 and 33. A convergence is performed to obtain a coupling efficiency in the same manner as that of EXAMPLE 1.

Comparative Example

By utilizing the duct portion 12 and the LD bar of the type used in EXAMPLE 1, a coupling efficiency is obtained in the same manner as that of EXAMPLE 1.

The results are show in TABLE 1.

TABLE 1

| EXAMPLE | COUPLING EFFICIENCY |
|---|---|
| 1 | 90~95% |
| 2 | 60~70% |
| 3 | 90~95% |
| 4 | 90~95% |
| 5 | 90~95% |
| 6 | 90~95% |
| 7 | 90~95% |
| COMPARATIVE EXAMPLE | 10~15% |

As can be seen from TABLE 1, a high coupling efficiency can be realized by the converging device of the present invention.

B. Laser Oscillation by a Laser Device

EXAMPLE 8

A laser oscillation and an optical signal amplification are performed utilizing the laser device 20 shown in FIG. 34.

A copper cylinder 22a having an outer diameter of 10 cm and an inner diameter of 9 cm is plated with gold and then thinly coated with a resin having a refractive index of approximately 1.38.

Around the cylinder 22a, a glass sheet having a width of 60 mm, a thickness of 500 $\mu$m and a length of 314 mm is wound while being heated by a carbon dioxide gas laser to provide an optical member 22. The glass sheet is made of silica glass by a polishing method.

An optical fiber 24 having a length of 125 m is wound 400 times around the optical member 22 to provide the laser device 20. As the optical fiber, a laser fiber made of silica glass, having a core diameter of 50 $\mu$m and a cladding diameter of 125 $\mu$m in which neodymium ions ($Nd^{3+}$) are doped in the core is used.

One end 24a of the optical fiber 24 is polished to a flat surface and then provided with a multilayer coating having a reflectance of more than 98% at a laser oscillation wavelength of 1.06 $\mu$m. The other end 24b of the optical fiber 24 is a vertical broken surface without being coated or the like. The reflectance of the other end 24b is approximately 4% at a laser oscillation wavelength of 1.06 $\mu$m.

As the LD bar 16 and the converging device 10, the LD bar and the converging device of the type used in the above EXAMPLES 1, 4 and 6 is used. The output end 14b of the guide portion 14 is connected to one end of the optical fiber 26 made of glass and having a diameter of 500 $\mu$m. The other end of the optical fiber 26 is connected to the upper end face of the optical member 22 by welding to introduce the pumping light.

The pumping light emitted from the LD bar 16 has a wavelength of 0.8 $\mu$m and an output power of 40 W. By the converging device 10, a pumping light of approximately 36–38 W is introduced to the optical member 22. A laser beam having a wavelength of 1.06 $\mu$m is emitted from the output end 24b of the optical fiber 24 and a laser power of the laser beam is measured.

The results are shown in TABLE. 2.

TABLE 2

| CONVERGING DEVICE | OUTPUT LASER POWER |
|---|---|
| EXAMPLE 1 | 15 W |
| EXAMPLE 4 | 16 W |
| EXAMPLE 6 | 16 W |

Both ends 24a, 24b of the optical fiber 24 are pulled out so as to have vertical broken surfaces to provide the optical signal amplifier. As the converging device 10, the converging device 10 of the type provided in EXAMPLE 1 is used. When an optical signal having a wavelength of 1.06 $\mu$m and an output power of 500 $\mu$W is introduced from one end 24a of the optical fiber 24, an amplified light has an output power of 370 mW is output from the other end 24b of the optical fiber 24 to obtain a gain of 29 dB.

EXAMPLE 9

A laser oscillation and an optical signal amplification is conducted utilizing the laser device 30 shown in FIG. 35.

A supporting member 32 made of copper having a cylindrical shape is prepared. The supporting member 32 has a long circular cross-sectional shape, which has a circular shape at both sides with radius of 50 mm and straight portions with a length of 100 mm. The surface of the supporting member is coated with gold and then thinly coated with a resin having a refractive index of approximately 1.38.

An optical fiber 24 having a length of 40 m is wound 80 times around the supporting member 32. As the optical fiber 24, a laser fiber made of silica glass, having a core diameter of 50 μm and a cladding diameter of 250 μm is used in which neodymium ions ($Nd^{3+}$) are doped in the core at 0.5 at %.

One end of the optical fiber is polished to a flat surface and then provided with a multilayer coating having a reflectance of more than 98% at a laser oscillation wavelength of 1.06 μm. The other end of the optical fiber 24 is a vertical broken surface without being coated or the like. The reflectance of the other end is approximately 4% at a laser oscillation wavelength of 1.06 μm.

In the straight portion of the optical fiber 24, the same three duct portions are provided. As the duct portion, the duct portion 12 provided in the EXAMPLE 1 and the converging devices provided in the EXAMPLES 3 and 5 are used. The duct portion is fixed at a lateral side of the optical fiber 24 by a UV hardening resin having the same refractive index as the silica glass. The three duct portions 12 are connected every 20 windings of the optical fiber. The duct portion 12 is fixed at one position to the optical fiber wound at 500 μm pitch as shown in FIG. 36.

As the pumping source, three LD bars 16 of the type used in the EXAMPLE 1 are used. The light emitting surface of each LD bar 16 is placed adjacent the incident surface 12a of the duct portion 12.

A laser beam having a wavelength of 1.06 μm is emitted from the output end 24b of the optical fiber 24 and a laser power of the laser beam is measured.

The results are shown in TABLE. 3.

TABLE 3

| DUCT PORTION | OUTPUT LASER POWER |
| --- | --- |
| EXAMPLE 1 | 38 W |
| EXAMPLE 3 | 39 W |
| EXAMPLE 5 | 39 W |

Also, in the above laser device, three duct portions 12 of the type obtained in EXAMPLE 1 are connected at two positions to the neighboring optical fibers wound at 250 μm pitch as shown in FIG. 37. As the pumping source, three LD bars 16 of the type used in the EXAMPLE 1 are used. As a result, a laser beam can be obtained having a wavelength of 1.06 μm and an output power of 48 W.

Further, both ends 24a, 24b of the optical fiber 24 are pulled out so as to be vertical broken surfaces to obtain the optical signal amplifier. As the duct portion 12, a duct portion of the type used in the EXAMPLE 1 is used. The three duct portions are fixed to the optical fiber wound at 250 μm pitch at two neighboring positions as shown in FIG. 37. When an optical signal having a wavelength of 1.06 μm and an output power of 100 μW is introduced from one end 24a of the optical fiber 24, an amplified light having a output power of 290 mW to obtain a gain of 35 dB.

EXAMPLE 10

A laser oscillation and optical signal amplification is conducted utilizing the laser device 35 shown in FIG. 38.

A laser fiber made of silica glass, having a core diameter of 50 μm and a cladding diameter of 125 μm in which neodymium ions ($Nd^{3+}$) are doped in the core at 0.5 at % is wound a plurality of times to prepare a circular plate. The circular plate has an inner diameter of 15 cm, an outer diameter of 17 cm and a thickness of 150 μm. The circular plate is made as a unitary body by utilizing a UV hardening resin having the same refractive index as the silica glass to obtain the optical fiber member 36.

One end of the optical fiber is polished to the flat surface and then provided a multilayer coating having a reflectance of more than 98% at a laser oscillation wavelength of 1.06 μm. The other end of the optical fiber 24 is a vertical broken surface without being coated or the like. The reflectance of the other end is approximately 4% at a laser oscillation wavelength of 1.06 μm.

As the converging device, the converging device 10 of the type provided in the EXAMPLES 3, 5 and 7 is used. By utilizing a carbon dioxide laser, a curved face having a length of 15 mm is formed in the reflective surface 12b adjacent the tip portion to form the connecting portion 12i. The connecting portion 12i of the converging device 10 is connected to the outer edge of the optical fiber member 36 by a UV hardening resin. The optical fiber member 36 is fixed between the heat radiation plates made of metal through a resin sheet i.e. FEP sheet having a thickness of 0.1 mm and a low refractive index.

The LD bar 16 of the type used in the EXAMPLE 1 is used herein. The light emitting surface of each LD bar 16 is placed adjacent the incident surface 12a of the duct portion 12. When pumping light having a wavelength of 0.8 μm and output power of 40 W is introduced, a laser beam having a wavelength of 0.8 μm is emitted from the output end 24b of the optical fiber 24 and a laser power of the laser beam is measured.

The results are shown in TABLE. 4.

TABLE 4

| CONVERGING DEVICE | OUTPUT LASER POWER |
| --- | --- |
| EXAMPLE 3 | 16 W |
| EXAMPLE 5 | 16 W |
| EXAMPLE 7 | 17 W |

As can be seen from the above results, the laser device having a high laser oscillation efficiency can be provided according to the present invention.

According to the converging device and the light source module of the present invention, the number of reflections of the light in the converging portion can be reduced by introducing the light reaching the reflective surface in the guide portion. Thus, the light reaches the vertex of the converging portion before the incident angle of the light in the reflective surface becomes smaller than the critical angle of the total reflection. Therefore, light having a large aspect ratio, which is emitted from the LD bar or the like, can be converged to a smaller spot. In addition, since the present invention has a simple structure comparing the conventional device including a plurality of parts, time and cost for the production and the adjustment can be reduced.

According to the laser device and the optical signal amplifier of the present invention, the converged light with a high energy density, which is converged by the above converging device, is used as a pumping light for laser oscillation and optical signal amplification. Therefore, the convergence and amplification with a high efficiency can be performed.

The present invention is not limited to these embodiments, but various variations and modifications may be made without departing from the scope of the present invention. For example, the converging device and the laser device of the present invention can be produced by combining the above-described technical features in a desired manner.

What is claimed is:

1. A converging device comprising:

a converging portion for converging a light, said converging portion having an incident surface in which a light to be converged is introduced, a tip portion provided in an opposite side of said incident surface in a direction of transmission of said light and a reflective surface for reflecting said light introduced from said incident surface so that said light is transmitted toward said tip portion; and a guide portion provided in said reflective surface along a direction from said incident surface to said tip portion;

wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion.

2. A converging device according to claim 1, wherein said converging portion is formed in a shape of a triangle and made of a thin plate which is optically transparent with respect to a wavelength of light to be converged, said incident surface being a surface at one side of said triangle extending in a thickness direction of the converging portion, said reflective surface being a surface at other side of said triangle which extends in a thickness direction of said converging portion, and said tip portion being a vertex of said triangle spaced from said incident surface.

3. A converging device according to claim 1, wherein said guide portion is provided along from said incident surface to said tip portion.

4. A converging device according to claim 1, wherein said guide portion is formed in a shape of a fiber.

5. A converging device according to claim 3, wherein said guide portion has a free curved surface formed by melting said reflective surface of said converging portion.

6. A converging device according to claim 4, wherein said converging portion has a shape of a thin plate, and a maximum thickness of said guide portion in a thickness direction of said converging portion is more than two times that of said converging portion.

7. A converging device according to claim 4, wherein said converging portion has a shape of a thin plate and a gap is formed between the center of said converging portion and that of said guide portion.

8. A light source module comprising:

a light source having a light emitting surface for emitting a light, said light emitting surface having a short axis and a long axis; and a converging device for converging said light, said converging device comprising a converging portion for converging said light, said converging portion having an incident surface in which a light to be converged is introduced, a tip portion provided in an opposite side of said incident surface in a direction of transmission of said light and a reflective surface for reflecting said light introduced from said incident surface so that said light is transmitted toward said tip portion, and a guide portion provided in said reflective surface along a direction from said incident surface to said tip portion, wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion.

9. A light source module comprising:

a light source having a light emitting surface for emitting a light, said light emitting surface having a short axis and a long axis; and a plurality of converging devices for converging said light, said converging device is aligned in one of a horizontal direction and a vertical direction, each of said converging device comprising a converging portion for converging said light, said converging portion having an incident surface in which a light to be converged is introduced, a tip portion provided in an opposite side of said incident surface in a direction of transmission of said light and a reflective surface for reflecting said light introduced from said incident surface so that said light is transmitted toward said tip portion, and a guide portion provided in said reflective surface along a direction from said incident surface to said tip portion, wherein said light transmitted in said converging portion is introduced to said guide portion and said introduced light in said guide portion is reflected so that said light is transmitted toward one end of said guide portion in a tip portion side, said light transmitted in said guide portion toward said converging portion is transmitted by maintaining a condition of substantially total reflection with respect to said reflective surface of said converging portion, and said converged light is emitted from at least one of said tip portion and said one end of said guide portion.

10. A laser device comprising:

a laser fiber including a laser medium, said laser fiber outputting a laser beam when said laser medium is pumped;

a light source for emitting a pumping light to pump said laser medium;

a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, and said converged pumping light is emitted from at least one of said tip portion and said one end of said guide portion;

a optical member made of an optically transparent material with respect to said pumping light, in which said pumping light converged by said converging device is confined; and wherein at least a part of a lateral side of said laser fiber is connected to said optical member either directly or via an optical medium and said laser medium is pumped by said pumping light transmitted from said optical member to said laser fiber.

11. A laser device comprising:

a pumping source for emitting a pumping light; and a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, wherein said guide portion is a laser fiber including a laser medium, said guide portion outputting a laser beam when said laser medium is pumped by said pumping portion.

12. An optical signal amplifier for amplifying an optical signal comprising a laser device, said laser device comprising a laser fiber including a laser medium, said laser fiber outputting a laser beam when said laser medium is pumped, a light source for emitting a pumping light to pump said laser medium, a converging device for converging said pumping light, said converging device comprising a converging portion for converging a light, said converging portion having an incident surface in which a pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, and said converged light is emitted from at least one of said tip portion and said one end of said guide portion, a optical member made of an optically transparent material with respect to said pumping light, in which said pumping light converged by said converging device is confined, and wherein at least a part of a lateral side of said laser fiber is connected to said optical member either directly or via an optical medium and said laser medium is pumped by said pumping light transmitted from said optical member to said laser fiber, wherein one end of said laser fiber is an input end of said optical signal and the other end is an output end of said optical signal.

13. An optical signal amplifier for amplifying an optical signal comprising a laser device, said laser device comprising a pumping source for emitting a pumping light, and a converging device for converging said pumping light, said converging device comprising a converging portion for converging said pumping light, said converging portion having an incident surface in which said pumping light to be converged is introduced, a tip portion provided in an opposite side of said incident surface in a direction of transmission of said pumping light and a reflective surface for reflecting said pumping light introduced from said incident surface so that said pumping light is transmitted toward said tip portion, and a guide portion provided in said reflective surface along a direction from said incident surface to said tip portion, wherein said pumping light transmitted in said converging portion is introduced to said guide portion and said introduced pumping light in said guide portion is reflected so that said pumping light is transmitted toward one end of said guide portion in a tip portion side, said pumping light transmitted in said guide portion toward said converging portion is transmitted by maintaining a condition of substantially total reflection with respect to said reflective surface of said converging portion, wherein said guide portion is a laser fiber including a laser medium, said guide portion outputting a laser beam when said laser medium is pumped by said pumping portion, wherein one end of said laser fiber is an input end of said optical signal and the other end is an output end of said optical signal.

* * * * *

UNITED STATES PATENT AND TRADEMARK OFFICE
CERTIFICATE OF CORRECTION

PATENT NO.    : 6,466,361 B2
DATED         : October 15, 2002
INVENTOR(S)   : Hitoshi Yamaura and Hiroshi Sekiguchi It is certified that error appears in the above-identified patent and that said Letters Patent is hereby corrected as shown below:

<u>Title page,</u>
Item [75], Inventors, remove the word "Akishima" and replace it with
-- Akishima-shi --.

<u>Column 2,</u>
Line 10, remove the words "Thus, the".

Signed and Sealed this

Seventeenth Day of June, 2003

JAMES E. ROGAN
*Director of the United States Patent and Trademark Office*